United States Patent
Sekar et al.

(10) Patent No.: US 7,440,327 B1
(45) Date of Patent: Oct. 21, 2008

(54) NON-VOLATILE STORAGE WITH REDUCED POWER CONSUMPTION DURING READ OPERATIONS

(75) Inventors: Deepak Chandra Sekar, Atlanta, GA (US); Nima Mokhlesi, Los Gatos, CA (US); Hock C. So, Redwood City, CA (US)

(73) Assignee: SanDisk Corporation, Milpitas, CA (US)

( * ) Notice: Subject to any disclaimer, the term of this patent is extended or adjusted under 35 U.S.C. 154(b) by 13 days.

(21) Appl. No.: 11/740,096

(22) Filed: Apr. 25, 2007

(51) Int. Cl.
*G11C 16/04* (2006.01)

(52) U.S. Cl. .......................... 365/185.18; 365/185.17; 365/185.21

(58) Field of Classification Search ............. 365/185.18
See application file for complete search history.

(56) References Cited

U.S. PATENT DOCUMENTS

| | | | |
|---|---|---|---|
| 5,270,969 A | 12/1993 | Iwahashi | |
| 5,386,422 A | 1/1995 | Endoh | |
| 5,522,580 A | 6/1996 | Varner, Jr. | |
| 5,570,315 A | 10/1996 | Tanaka | |
| 5,677,873 A | 10/1997 | Choi | |
| 5,715,194 A | 2/1998 | Hu | |
| 5,774,397 A | 6/1998 | Endoh | |
| 5,991,202 A | 11/1999 | Derhocobian | |
| 6,046,935 A | 4/2000 | Takeuchi | |
| 6,222,762 B1 | 4/2001 | Guterman | |
| 6,456,528 B1 | 9/2002 | Chen | |
| 6,522,580 B2 | 2/2003 | Chen | |
| 6,522,583 B2 | 2/2003 | Kanda | |
| 6,859,395 B2 | 2/2005 | Matsunaga | |
| 6,859,397 B2 | 2/2005 | Lutze | |
| 6,975,537 B2 | 12/2005 | Lutze | |
| 6,987,694 B2 | 1/2006 | Lee | |
| 7,009,881 B2 | 3/2006 | Noguchi | |
| 7,020,026 B2 | 3/2006 | Guterman | |
| 7,023,737 B1 | 4/2006 | Wan | |
| 7,046,568 B2 | 5/2006 | Cernea | |
| 7,054,195 B2 | 5/2006 | Matsunaga | |
| 7,064,981 B2 * | 6/2006 | Roohparvar | 365/185.17 |
| 7,088,621 B2 | 8/2006 | Guterman | |

(Continued)

OTHER PUBLICATIONS

N. Shibata et al., A 70nm 16Gb 16-level-cell NAND Flash Memory, 2007 Symp. on VLSI Circuits Digest of Technical Papers, pp. 190-191, Jun. 14-16, 2007.

(Continued)

*Primary Examiner*—Son L Mai
(74) *Attorney, Agent, or Firm*—Vierra Magen Marcus & DeNiro LLP

(57) ABSTRACT

A non-volatile storage device in which power consumption is reduced by providing reduced read pass voltages on unselected word lines during a read operation. A programming status of one or more unselected word lines which are after a selected word line on which storage elements are being read is checked to determine whether the unselected word lines contain programmed storage elements. When an unprogrammed word line is identified, reduced read pass voltages are provided on that word line and other word lines which are after that word line in a programming order. The programming status can be determined by a flag stored in the word line, for instance, or by reading the word line at the lowest read state. The unselected word lines which are checked can be predetermined in a set of word lines, or determined adaptively based on a position of the selected word line.

38 Claims, 18 Drawing Sheets

U.S. PATENT DOCUMENTS

| | | | |
|---|---|---|---|
| 7,123,518 | B2 | 10/2006 | Cheng |
| 7,161,833 | B2 | 1/2007 | Hemink |
| 7,170,788 | B1 | 1/2007 | Wan |
| 7,170,793 | B2 | 1/2007 | Guterman |
| 7,180,787 | B2 * | 2/2007 | Hosono et al. ......... 365/185.24 |
| 7,184,308 | B2 | 2/2007 | Kwon |
| 7,196,928 | B2 | 3/2007 | Chen |
| 7,342,831 | B2 * | 3/2008 | Mokhlesi et al. ....... 365/185.22 |
| 2002/0050607 | A1 * | 5/2002 | Nakamura et al. .......... 257/298 |
| 2003/0137873 | A1 | 7/2003 | Kawamura |
| 2004/0057285 | A1 | 3/2004 | Cernea |
| 2004/0057287 | A1 | 3/2004 | Cernea |
| 2004/0057318 | A1 | 3/2004 | Cernea |
| 2004/0109357 | A1 | 6/2004 | Cernea |
| 2004/0255090 | A1 | 12/2004 | Guterman |
| 2005/0024939 | A1 | 2/2005 | Chen |
| 2006/0126390 | A1 | 6/2006 | Gorobets |
| 2006/0140007 | A1 | 6/2006 | Cernea |
| 2006/0140012 | A1 | 6/2006 | Wan |
| 2006/0158947 | A1 | 7/2006 | Chan |
| 2006/0164904 | A1 | 7/2006 | Saleh |
| 2006/0198195 | A1 | 9/2006 | Hemink |
| 2006/0203557 | A1 | 9/2006 | Fukuda |
| 2006/0250850 | A1 | 11/2006 | Lee |
| 2007/0279995 | A1 | 12/2007 | Mokhiesi |
| 2008/0055985 | A1 * | 3/2008 | Kanda ................... 365/185.03 |

OTHER PUBLICATIONS

Y. Zhang et al., An Integrated Phase Change Memory Cell With Ge Nanowire Diode For Cross-Point Memory, 2007 Symp. on VLSI Circuits Digest of Technical Papers, pp. 98-99, Jun. 14-16, 2007.

D.H. Kang et al., Novel Heat Dissipating Cell Scheme For Improving A Reset Distribution In A 512M Phase-Change Random Access Memory (PRAM), 2007 Symp. on VLSI Circuits Digest of Technical Papers, pp. 96-97, Jun. 14-16, 2007.

H. Tanaka et al., Bit Cost Scalable Technology With Punch And Plug Process For Ultra High Density Flash Memory, 2007 Symp. on VLSI Circuits Digest of Technical Papers, pp. 14-15, Jun. 14-16, 2007.

U.S. Appl. No. 11/740,091, filed Apr. 25, 2007.

International Search Report dated Aug. 29, 2008, PCT Patent Application No. PCT/US2008/060630, filed Apr. 17, 2008.

Written Opinion of the International Searching Authority, dated Aug. 29, 2008, PCT Patent Application No. PCT/US2008/060630, filed Apr. 17, 2008.

* cited by examiner

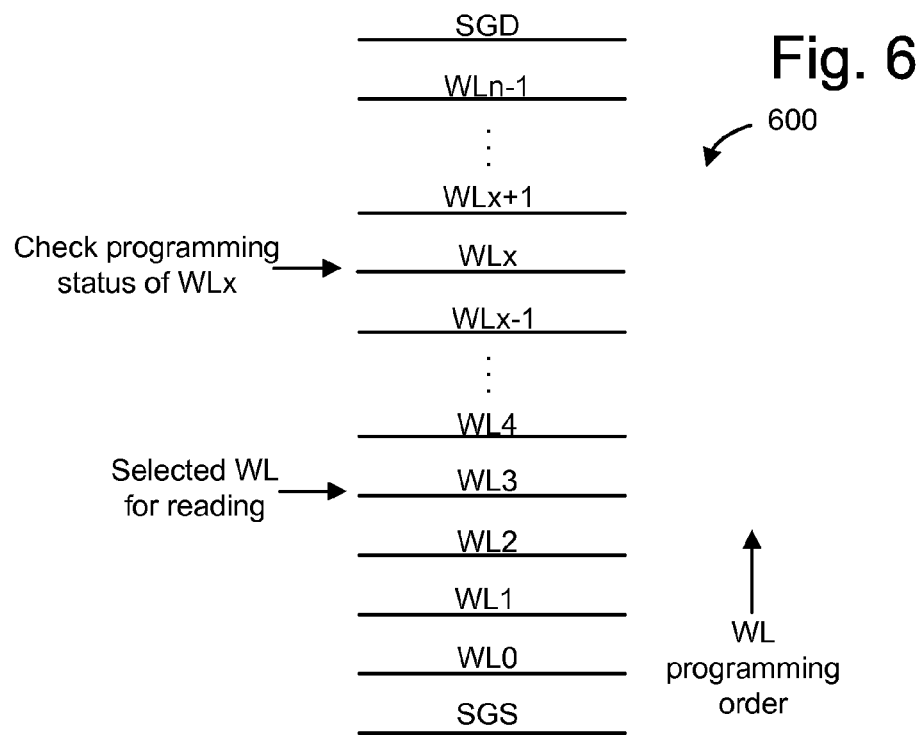
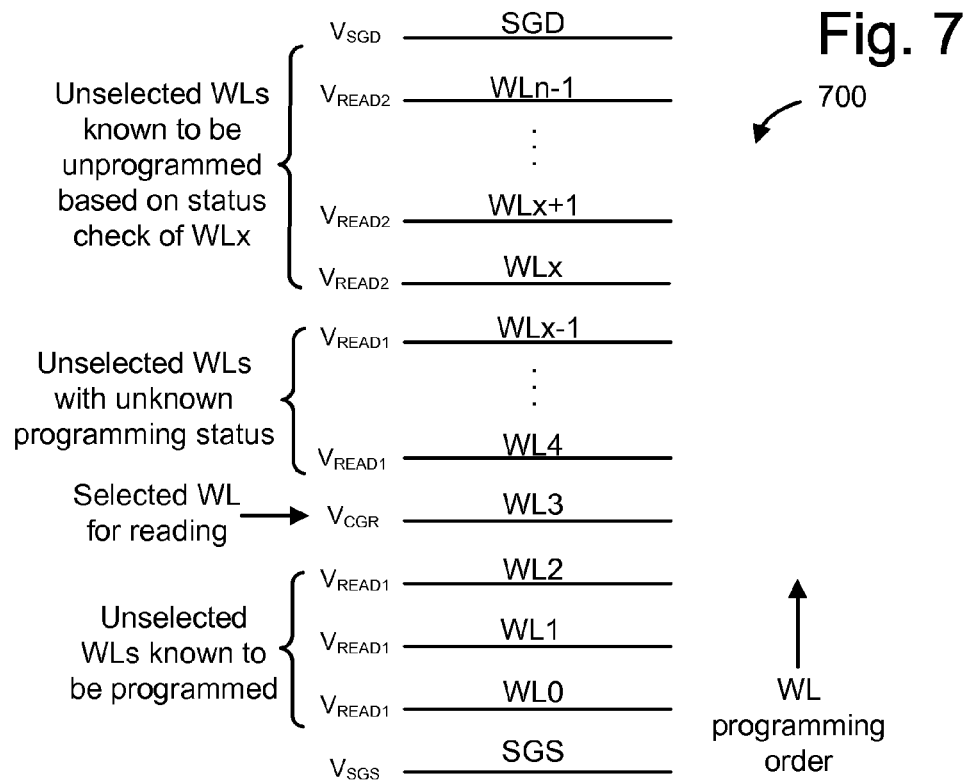

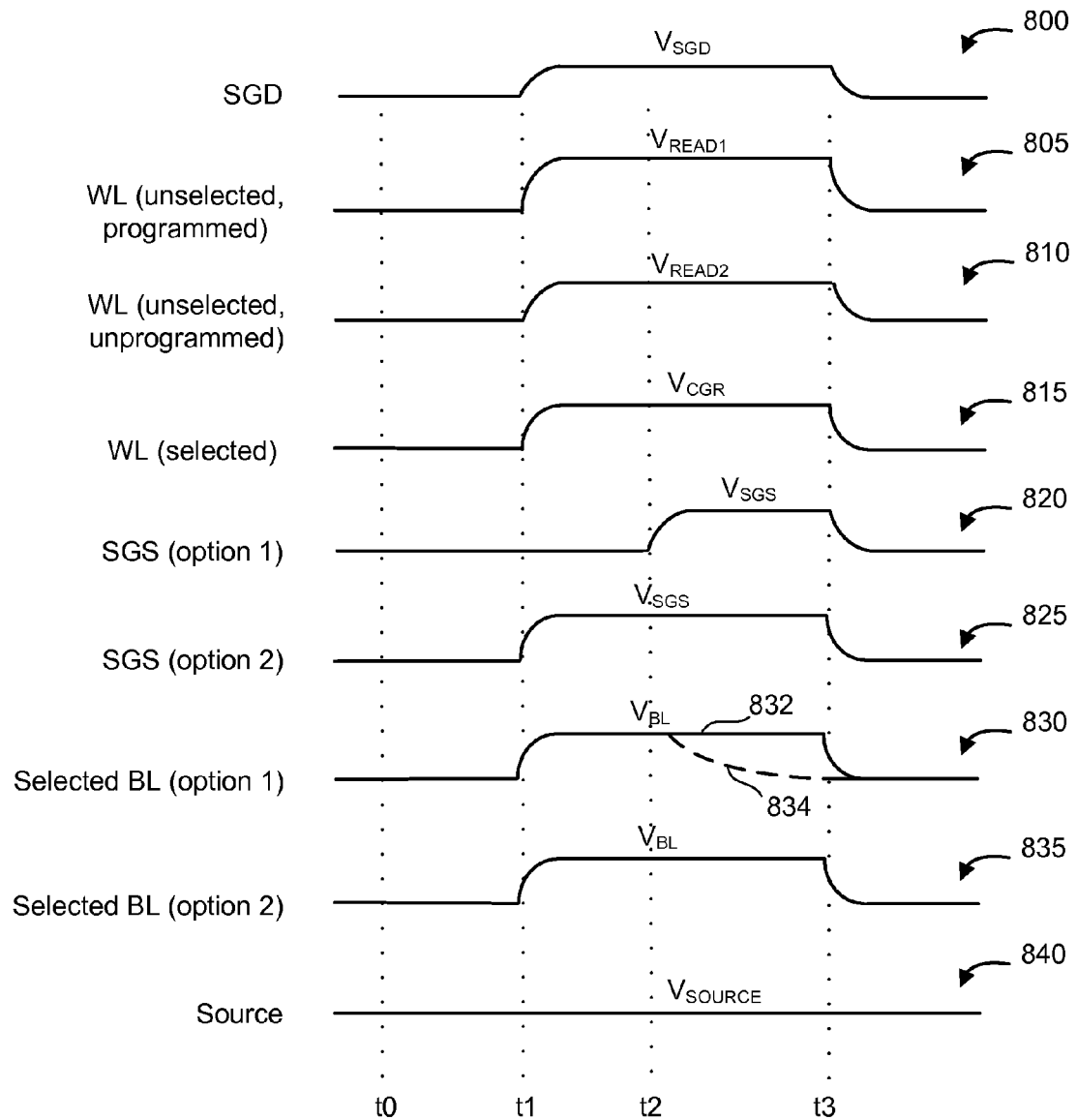

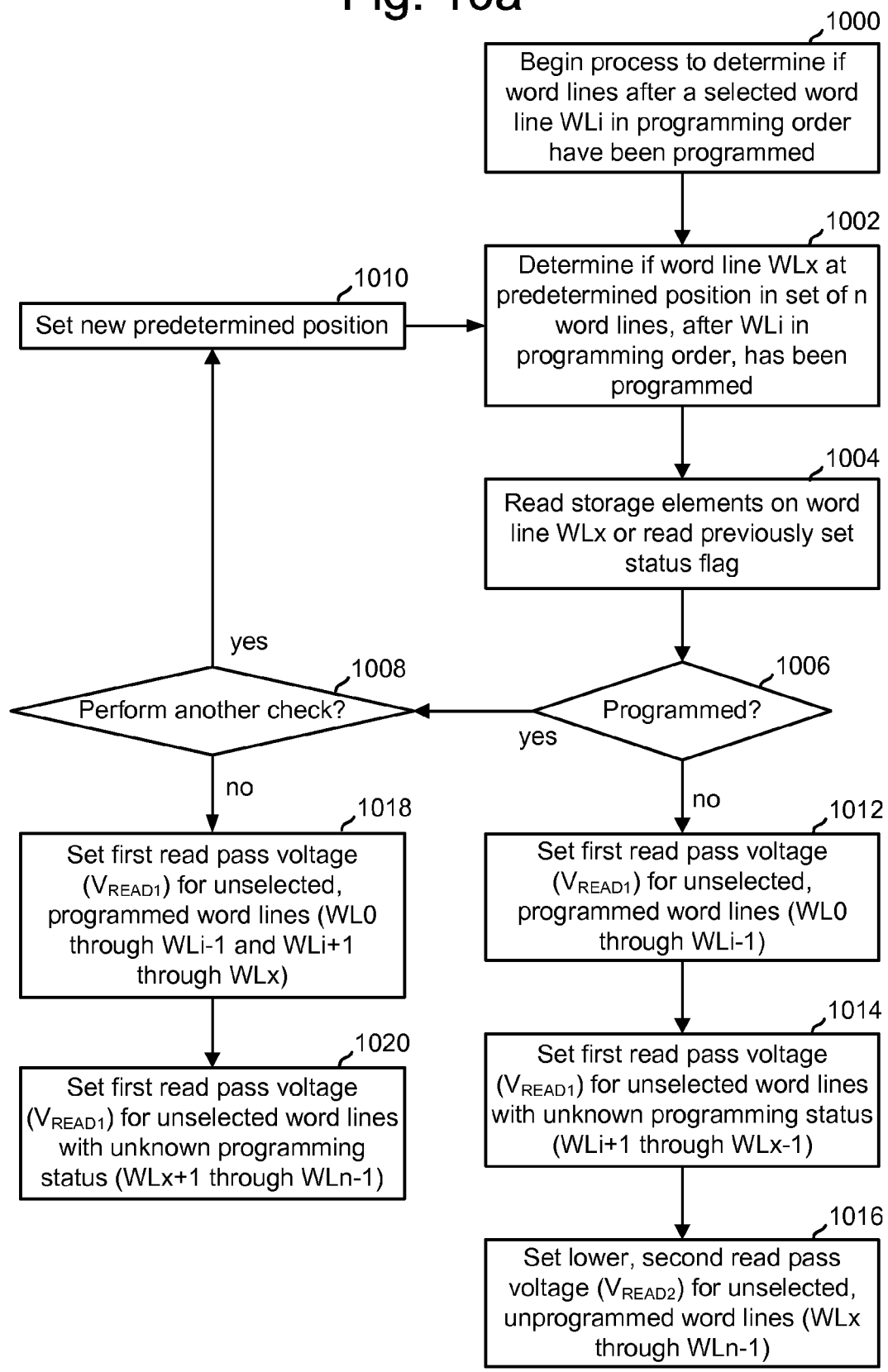

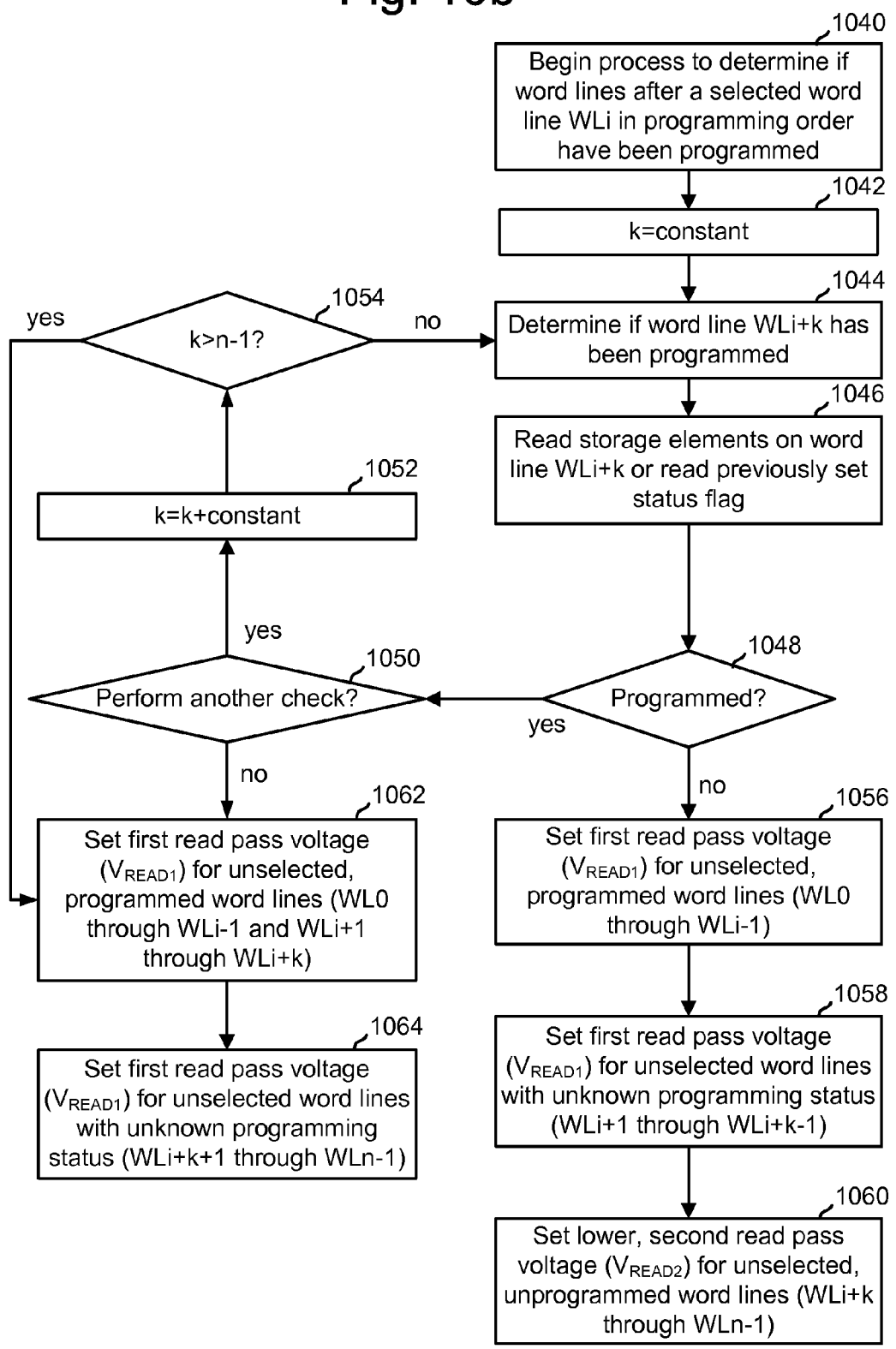

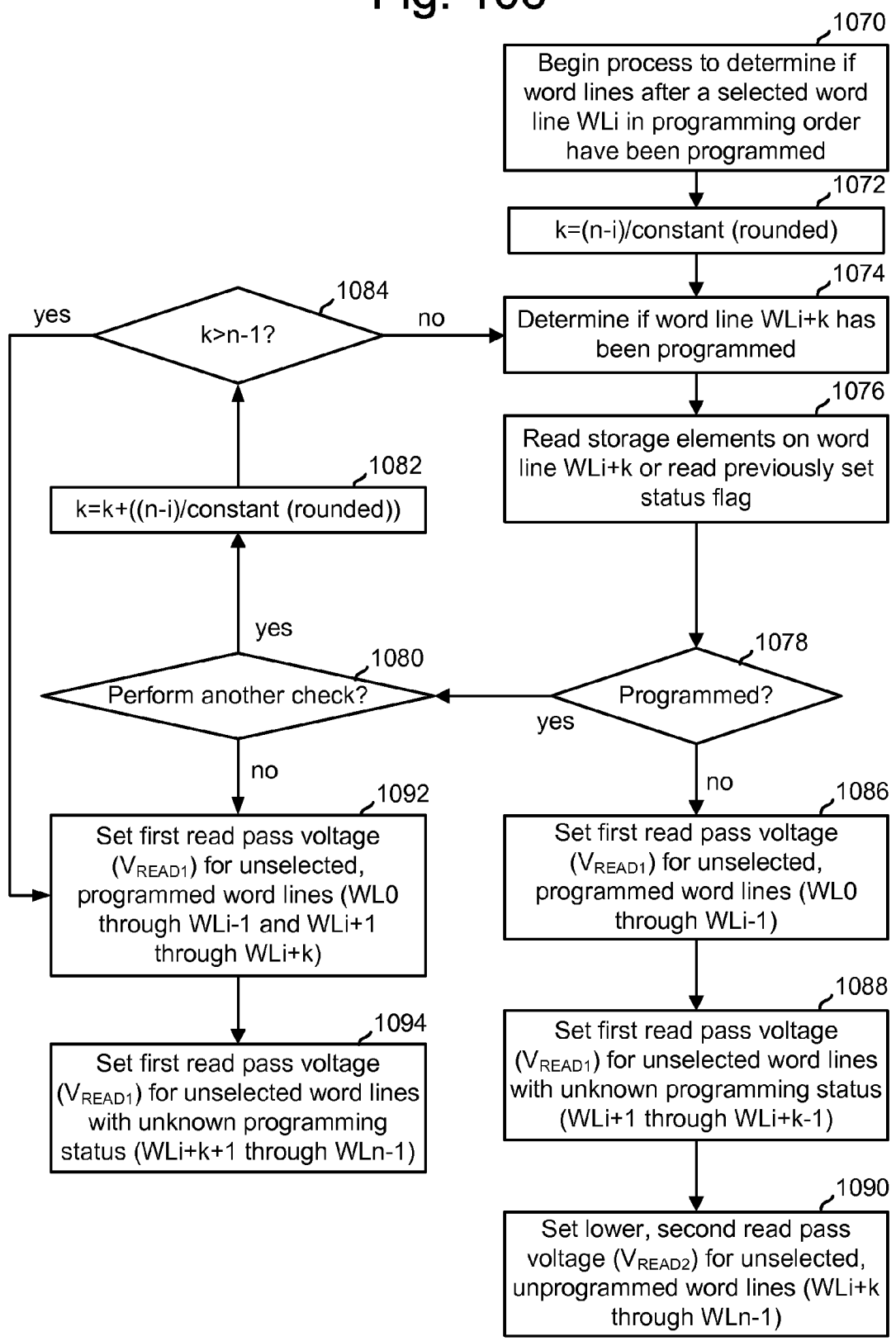

NON-VOLATILE STORAGE WITH REDUCED POWER CONSUMPTION DURING READ OPERATIONS

CROSS-REFERENCE TO RELATED APPLICATIONS

This application is related to co-pending, commonly assigned U.S. patent application Ser. No. 11/740,091, filed herewith, titled "Reducing Power Consumption During Read Operations In Non-Volatile Storage", incorporated herein by reference.

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent App. Pub. 2005/0024939, titled "Detecting Over Programmed Memory," published Feb. 3, 2005; both of which are incorporated herein by reference in their entirety.

However, one issue with memory devices is the need to reduce power consumption whenever possible, e.g., to reduce battery consumption and heat build up in portable electronic devices which use non-volatile memory.

SUMMARY OF THE INVENTION

The present invention addresses the above and other issues by providing non-volatile storage in which power consumption during a read operation is reduced. Power consumption is reduced in particular when many of the storage elements are in an erased, e.g., unprogrammed, state.

In one embodiment, a non-volatile storage system includes a set of non-volatile storage elements, a set of word lines in communication with the set of non-volatile storage elements, and one or more control circuits in communication with the set of non-volatile storage elements and the set of word lines. The one or more control circuits: a) in connection with performing a sense operation on at least one non-volatile storage element associated with a first word line, determine whether or not there is at least one non-volatile storage element associated with a second word line which is in a programmed state, b) apply a first voltage to the second word line while performing the sense operation when there is at least one non-volatile storage element associated with the second word line which is in a programmed state, and c) apply a second voltage to the second word line while performing the sense operation when there is not at least one non-volatile storage element associated with the second word line which is in a programmed state.

In another embodiment, a non-volatile storage system of the type mentioned above is provided in which the one or more control circuits: a) determine whether or not a first set of word lines includes at least one programmed non-volatile storage element, b) perform a sense operation on at least one non-volatile storage element associated with a first word line, the first word line is not in the first set of word lines, c) apply a first voltage to the first set of word lines while performing the sense operation when the one or more control circuits determine that the first set of word lines includes at least one programmed non-volatile storage element, and d) apply a second voltage to the first set of word lines while performing the sense operation when the one or more control circuits determine that the first set of word lines does not include at least one programmed non-volatile storage element.

In another embodiment, a non-volatile storage system of the type mentioned above is provided in which the one or more control circuits: a) store data which indicates whether or not a first word line has been used in a programming operation since a last erase operation, and b) access the data for use in setting a level of a voltage which is applied to the first word line during a sense operation of at least one non-volatile storage element associated with a second word line.

BRIEF DESCRIPTION OF THE DRAWINGS

FIG. 6 depicts checking a programming status of an unselected word line in a set of word lines.

FIG. 7 depicts voltages applied to a set of word lines during a read operation, including a higher read pass voltage applied to programmed word lines and a lower read pass voltage applied to unprogrammed word lines.

FIG. 8 is a timing diagram that explains the behavior of certain waveforms during a read operation.

FIG. 10a depicts a flowchart of a first process for determining whether unselected word lines in a set of word lines have been programmed.

FIG. 10b depicts a flowchart of a second process for determining whether unselected word lines in a set of word lines have been programmed.

FIG. 10c depicts a flowchart of a third process for determining whether unselected word lines in a set of word lines have been programmed.

DETAILED DESCRIPTION

The present invention provides a non-volatile storage in which power consumption during a read operation is reduced.

Figure 1:
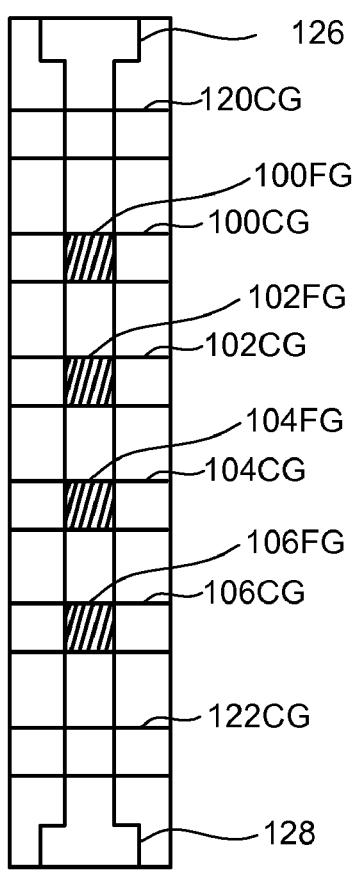
FIG. 1 is a top view of a NAND string.
Figure 2:
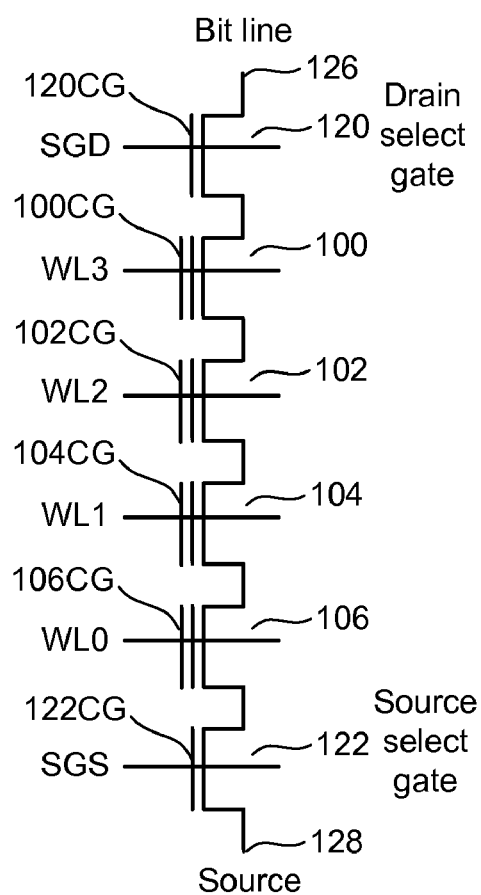
FIG. 2 is an equivalent circuit diagram of the NAND string of FIG. 1.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. The control gates can also be provided as portions of the word lines. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD (drain select gate). Select gate 122 is connected to select line SGS (source select gate).

Figure 3:
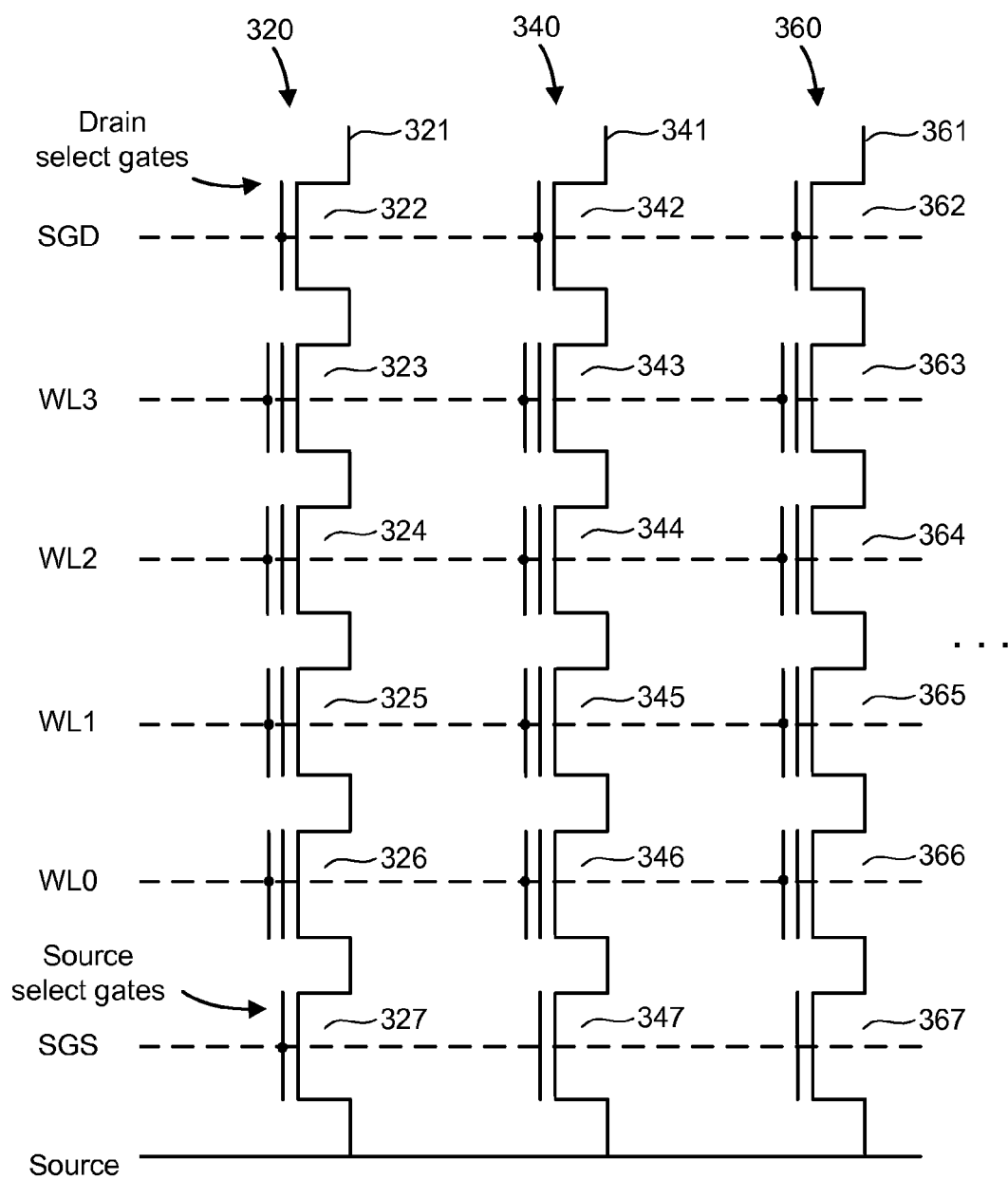
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Patent Application Pub. 2004/0255090, both of which are incorporated herein by reference in their entirety, describe various data encoding schemes for multi-state flash storage elements.

Relevant examples of NAND type flash memories and their operation are provided in U.S. Pat. Nos. 5,386,422, 5,522,580, 5,570,315, 5,774,397, 6,046,935, 6,456,528 and 6,522,580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

Figure 4:
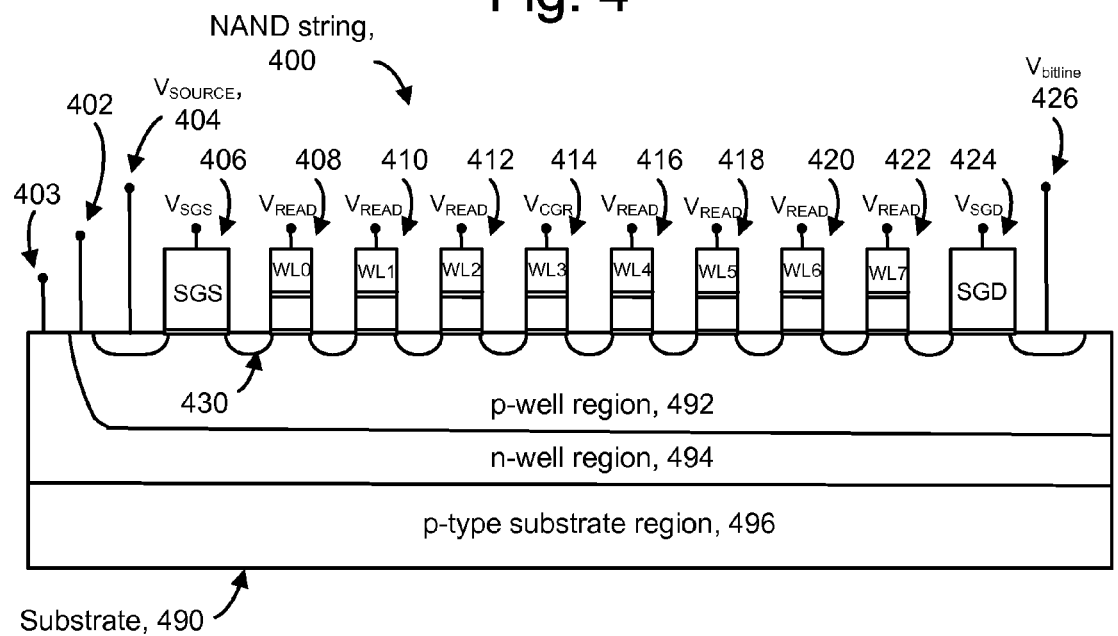
FIG. 4 depicts a cross-sectional view of a NAND string formed on a substrate.

FIG. 4 depicts a cross-sectional view of an NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one approach, the substrate 490 employs a triple-well technology which includes a p-well region 492 within an n-well region 494, which in turn is within a p-type substrate region 496. The NAND string and its non-volatile storage elements can be formed, at least in part, on the p-well region. A source supply line 404 with a potential of $V_{SOURCE}$ is provided in addition to a bit line 426 with a potential of $V_{BIT\ LINE}$. Voltages can also be applied to the p-well region 492 via a terminal 402 and to the n-well region 494 via a terminal 403.

During a read operation, a control gate voltage $V_{CGR}$ is provided on a selected word line, in this example, WL3, which is associated with storage element 414. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A read pass voltage, $V_{READ}$ is applied to the remaining word lines associated with NAND string 400, in one possible boosting scheme. $V_{SGS}$ and $V_{SGD}$ are applied to the select gates 406 and 424, respectively.

Figure 5:
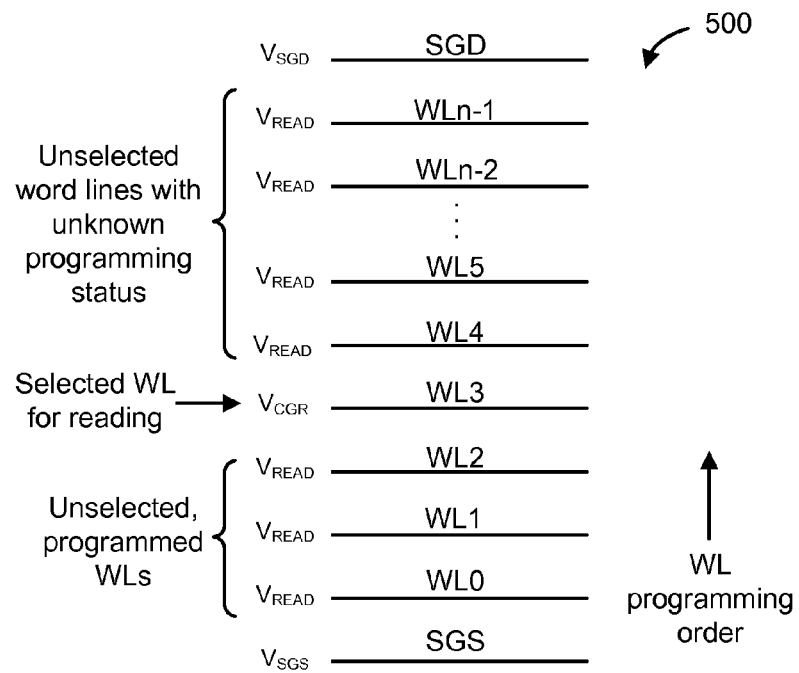
FIG. 5 depicts voltages applied to a set of word lines during a read operation.

FIG. 5 depicts voltages applied to a set of word lines 500 during a read operation. In this example, there are n word lines, WL0 through WLn–1, which are programmed in a word line order starting at WL0 and ending at WLn–1. Note that programming can proceed one word line at a time, in one possible approach, in which case storage elements associated with WL0 are fully programmed to desired programming states, then storage elements associated with WL1 are fully programmed to desired programming states, and so forth. A word line programming order in this case is: WL0, WL1, WL2, . . . .

In another possible approach, storage elements associated with a word line are programmed in multiple passes. For example, the following steps may occur: 1) storage elements associated with WL0 are partially programmed, 2) storage elements associated with WL1 are partially programmed, 3) the programming of the storage elements associated with WL0 is completed, 4) storage elements associated with WL2 are partially programmed, 5) programming of the storage elements associated with WL1 is completed, 6) storage elements associated with WL3 are partially programmed, 7) programming of the storage elements associated with WL2 is completed, and so forth. A word line programming order in this case is: WL0, WL1, WL0, WL2, WL1, WL3, WL2 . . . . Various other programming techniques and word line programming orders are possible.

In some cases, all of the storage elements in a block or other set of storage elements are needed to store data. However, in other cases, only some of the storage elements are needed to store data. Thus, when a read operation is subsequently performed, it is not known whether all or only a portion of a set of storage elements has been programmed with data. Storage elements which are not programmed with data are generally in an erased state. For example, when WL3 is the word line selected for reading, it is known that the word lines which occur previously in a word line programming order, e.g., WL0 through WL2 have been programmed. That is, these word lines have been used for programming associated storage elements so that the associated storage elements are either partially or fully programmed. On the other hand, the word lines which occur after the selected word line in the word line programming order, e.g., WL4 through WLn–1 have an unknown programming status. That is, WL3 may or may not be the last programmed word line in the set of word lines. The word lines other than the selected word line are referred to as unselected word lines. In this example, the read pass voltage, $V_{READ}$, is applied to each of the unselected word lines.

However, the use of a fixed $V_{READ}$ value for the unselected word lines can result in unnecessary energy consumption. For example, consider a scenario where pages of data are written to WL0 but no other pages are written to the other word lines, so the storage elements of WL1 through WLn–1 remain in the erased state. When reading the state of the storage elements on WL0, each programmed storage element will be in a NAND string with several unprogrammed storage elements. Moreover, the resistance of the NAND string, $R_{NAND}$, is lower when the storage elements are in the erased state. The following equation expresses $R_{NAND}$ as a function of $R_{SD}$, the resistance of the source-drain regions of a NAND string and of the source and drain side select gates, $V_{WL}$, the applied word line voltage, and $V_{TH}$, the threshold voltage of the storage element associated with a word line, and a constant k:

$$R_{NAND} = R_{SD} + \sum \frac{k}{V_{WL} - V_{TH}}.$$

As a result, when the difference between the applied word line voltage $V_{WL}$ and the threshold voltage $V_{TH}$ is high, $R_{NAND}$ is low. For example, $R_{NAND}$ can be cut by half when all storage elements in a NAND string are in the erased state compared to when all storage elements in the NAND string are in the highest programmed state. Further, due to the relationships $$R_{NAND} = \frac{V_{BL}}{I_{CELL}}$$

and P=IV, a higher $R_{NAND}$ results in a higher $I_{CELL}$, a higher power consumption (P) and a higher maximum instantaneous current.

Note also, that when a word line is programmed, e.g., written, a "randomization" feature may be used to ensure that the data patterns stored in storage elements are random. In this case, there will likely be a few storage elements in the highest programming state (e.g., the 'C' state) in each NAND string.

One approach to reducing power consumption is to lower $V_{WL}$, the word line voltage applied to the unselected word lines. For the unselected word lines which are known to be programmed, e.g. based on the position of the currently selected word line and the word line programming order, this may not be feasible since some of the storage elements may be programmed to the highest programming state and it is desirable to maintain a sufficient margin to avoid read disturb. For the unselected word lines which are not programmed, the applied word line voltage can be safely reduced, resulting in reduced power consumption without increasing read disturbs. A further expected benefit is reduced threshold voltage distributions. These advantages can be achieved in various ways.

FIG. 6 depicts voltages applied to a set of word lines 600 when checking a programming status of an unselected word line in a set of word lines. One possible approach to determining whether the word lines which are after the selected word line are programmed is to check the programming status of a predetermined word line, WLx. For example, with n=32 word lines, and WL3 as the selected word line, the programming status of WL23, for instance, could be checked. A flag can be stored in one or more storage elements associated with WL23, or elsewhere, which indicates whether the associated storage elements have been programmed. The flag is data which indicates whether or not the word line has been used in a programming operation since a last erase operation. When the word lines are being read sequentially, for instance, the WL23 flag can be checked once, before reading WL0, in which case read throughput would not be lost while reading WL1, WL2 . . . .

It is also possible to read the storage elements of WL23 to determine if the associated storage elements have been programmed, e.g., in a pre-read operation which occurs before the regular read operation. For example, a single sense operation can be performed at the lowest read level, e.g., Vra (see FIG. 16). If all of the non-volatile storage elements associated with word line are on, it can be concluded that they are unprogrammed. Otherwise, at least one non-volatile storage element is programmed. Further, it is possible to determine concurrently whether a set of multiple word lines includes at least one programmed non-volatile storage element. This can be achieved, e.g., by applying the lowest read level, e.g., Vra, to the multiple word lines at the same time. If at least one of the non-volatile storage elements associated with the word lines remain off, it can be concluded that at least one non-volatile storage element is programmed. Otherwise, the non-volatile storage elements associated with the multiple word lines are all unprogrammed. For example, the lowest read level can be applied as a pre-read voltage to WL23-WL31 to determine if the associated storage elements have been programmed.

If the storage elements associated with a word line have been programmed, the voltage applied to the word line is not reduced. If the associated storage elements have not been programmed, the voltage applied to the word line, as well as the word lines after WLx in the word line programming order, can be reduced. The programming status check could occur when the selected word line is before WLx in the word line programming order. For example, the check could occur when the selected word line is WL0 through WLx-1. It is also possible to check the programming status of other predetermined word lines if it is determined that a first unselected word line has been programmed. For example, with n=32 word lines, and WL3 as the selected word line, the programming status of WL23 could be checked first, then the programming status of WL27 could be checked if WL23 is programmed. If WL27 is not programmed, but WL23 is programmed, the word line voltages applied to WL27 through WL31, for instance, can be reduced. If WL27 is also programmed, it may be decided to not reduce any of the unselected word line voltages. In another example, WL7, WL15 and WL23 (with n=32) are candidates whose programming status can be checked. The candidate word line which is after the selected word line in word line programming order is checked first.

For instance, with WL8 as the selected word line to be read, the candidate word line which is checked first is WL15. WL7 is not checked because it occurs before the selected word line in the word line programming order and therefore is presumed to be programmed. If WL15 is not programmed, a reduced word line voltage is applied to WL15 through WL31. If WL15 is programmed, WL23 is checked. If WL23 is not programmed, a reduced word line voltage is applied to WL23 through WL31. If WL23 is programmed, no further check is made and no reduced word line voltages are applied.

Thus, one or more word lines which are in predetermined positions in a set of word lines can be checked to determine their programming status, and word line voltages can be set accordingly.

Another approach is to select one or more word lines to be checked adaptively based on the position of the current selected word line in the set of word lines. For example, the word line which is first checked for programming can be a given number of word lines after the current word line in the word line programming order. For example, if WL3 is the currently selected word line, the word line which is checked could be eight word lines higher, e.g., WL11. If WL11 is not programmed, a reduced voltage can be applied to WL11 through WL31. If WL11 is programmed, the next word line which is checked could be WL19. If WL19 is not programmed, a reduced voltage can be applied to WL19 through WL31. If WL19 is programmed, the next word line which is checked could be WL27. If WL27 is not programmed, a reduced voltage can be applied to WL27 through WL31. If WL27 is programmed, then no reduced word line voltages are used.

Generally, the specific technique used for checking the programming status of word lines can be based on the observation that the reduction in power consumption is greatest when the selected word line is relatively early in the programming order and there are a significant number of unprogrammed word lines after the selected word in the programming order. This can occur, for instance, when a storage element on a lower word line is being read and storage elements on higher word lines have not yet been programmed.

Various options for checking the programming status of word lines are discussed further in connection with FIGS. 10a-c.

FIG. 7 depicts voltages applied to a set of word lines 700 during a read operation, including a higher read pass voltage applied to programmed word lines and a lower read pass voltage applied to unprogrammed word lines. Here, the selected word line, WL3, receives a control gate read voltage, $V_{CGR}$. A determination is made that WLx is unprogrammed, in which case it is concluded that WLx+1 through WLn−1 are also unprogrammed. As a result, a reduced word line voltage, $V_{READ2}$, e.g., 2-4 V, is applied to WLx through WLn−1. The $V_{READ}$ voltages should be sufficiently high to turn on the associated storage elements to allow reading of the selected storage elements, but not so high as to cause read disturbs. In one approach, $V_{READ2}=V_{DD}$, a supply voltage. The programming status of the word lines after the selected word line but before WLx, e.g., WL4 through WLx−1, is unknown. As a result, a higher word line voltage, $V_{READ1}$, e.g., 6 V, is applied to WL4 through WLx−1, where $V_{READ1}>V_{READ2}$. These word lines are treated as being programmed as a conservative measure. Similarly, $V_{READ1}$ is applied to WL0 through WL2, which are known to be programmed because they are before the selected word line WL3 in the word line programming order.

The techniques provided herein can also be used during verify operations which occur in conjunction with programming. However, during programming, it is known that the word line after the selected word line is unprogrammed (erased). Thus, a reduced voltage can be applied to these word lines without performing any programming status checks.

The techniques provided herein can also be extended to reduce threshold voltage distribution widening due to changes in NAND chain resistance between verify and read. Instead of just looking at WL23, for instance, one could also look at WL31, WL16 and WL8, or use some other scheme to detect how many word lines have been written. Depending on the number of word lines written and the $V_{READ}$ values used during verify, one could compensate the $V_{READ}$ of higher word lines during read.

In another option, intermediate voltages between $V_{READ1}$ and $V_{READ2}$ are used. For example, instead of applying $V_{READ1}$ to WLx−1 and $V_{READ2}$ to WLx, we can apply $V_{READ1}$ to WLx−1, $V_{READ1.5}$ to WLx and $V_{READ2}$ to Wx+1, where $V_{READ1}>V_{READ1.5}>V_{READ2}$. This provides a gradual transition in the applied word line voltages.

FIG. 8 is a timing diagram that explains the behavior of certain waveforms during read/verify operations. In general, during read and verify operations, the selected word line or other control line is connected to a voltage, a level of which is specified for each read and verify operation, in order to determine whether a threshold voltage of the concerned storage element has reached such level. After applying the word line voltage, the conduction current of the storage element is measured to determine whether the storage element turned on. If the conduction current is measured to be greater than a certain value, then it is assumed that the storage element turned on and the voltage applied to the word line is greater than the threshold voltage of the storage element. If the conduction current is not measured to be greater than the certain value, then it is assumed that the storage element did not turn on and the voltage applied to the word line is not greater than the threshold voltage of the storage element.

There are many ways to measure the conduction current of a storage element during a read or verify operation. In one example, the conduction current of a storage element is measured by the rate it allows (or fails to allow) the NAND string that included the storage element to discharge the bit line. The charge on the bit line is measured after a period of time to see whether it has been discharged or not. In another embodiment, the conduction of the selected storage element allows current to flow or not flow on a bit line, which is measured by whether a capacitor in the sense amplifier is charged due to the flow of current. Both examples are discussed.

In particular, waveform 800 depicts a drain side select gate voltage (SGD), waveform 805 depicts a voltage which is applied to unselected word lines which are known to be programmed or which may be programmed, waveform 810 depicts a voltage which is applied to unselected word lines which are known to be unprogrammed, waveform 815 depicts a voltage which is applied to a selected word line (e.g., the word line selected for reading/verification), waveform 820 depicts a source side select gate (SGS) voltage (option 1), waveform 825 depicts a SGS voltage (option 2), waveform 830 depicts a selected bit line (BL) voltage (option 1) (of the bit line selected for reading/verification), waveform 835 depicts a selected BL voltage (option 2) and waveform 840 depicts a source voltage. Additionally, time points t0-t3 extend in the horizontal direction.

Note that there are two versions of SGS and Selected BL depicted. Option 1 depicts a read/verify operation for an array of storage elements that measure the conduction current of a storage element by determining whether the bit line has discharged. Option 2 depicts a read/verify operation for an array of storage elements that measure the conduction current of a storage element by the rate it discharges a dedicated capacitor in the sense amplifier.

First, the behavior of the sensing circuits and the array of storage elements that are involved in measuring the conduction current of a storage element by determining whether the bit line has discharged will be discussed with respect to option 1.

Prior to t1, the voltages start at a steady state voltage, Vss, of approximately 0 V. At t1, SGD and SGS (option 2) are raised to $V_{SGD}$ and $V_{SGS}$, respectively (e.g., 3.5 V). The unselected, programmed word lines are raised to $V_{READ1}$ while the unselected, unprogrammed word lines are raised to a lower value, $V_{READ2}$. Generally, $V_{READ}$ should be sufficiently high to turn on the associated storage elements to allow reading of the selected storage elements, but not so high as to cause read disturbs. $V_{READ}$ act as an overdrive voltage because it causes the unselected storage elements to turn on and act as pass gates. The selected word line is raised to $V_{CGR}$ (control gate read voltage) for a read operation or to a verify level for a verify operation. The waveform on the selected word line between t1 and t3 is considered to be a read pulse which is used during a sense operation. The selected BL (option 1) is pre-charged to approximately 0.7 V, in one approach.

At t2, the NAND string can control the bit line. Also at t2, the source side select gate is turned on by raising SGS (option 1) to $V_{SGS}$. This provides a path to dissipate the charge on the bit line. If the $V_{TH}$ of the storage element selected for reading is greater than $V_{CGR}$ or the verify level applied to the selected word line, then the selected storage element will not turn on and the bit line will not discharge, as depicted by line 832. If the threshold voltage in the storage element selected for reading is below $V_{CGR}$ or below the verify level applied to the selected word line, then the storage element selected for reading will turn on (conduct) and the bit line voltage will dissipate, as depicted by curve 834. At some point after time t2 and prior to time t3 (as determined by the particular implementation), the sense amplifier determines whether the bit line has dissipated a sufficient amount. In between t2 and t3, the sense amplifier measures the evaluated BL voltage. At time t3, the depicted waveforms are lowered to Vss (or another value for standby or recovery).

Discussed next, with respect to option 2, is the behavior of the sensing circuits and the array of storage elements that measure the conduction current of a storage element by the rate at which it charges a dedicated capacitor in the sense amplifier. At t1, SGD is raised to $V_{SGD}$, the unselected word lines are raised to $V_{READ1}$ or $V_{READ2}$, and the selected word line is raised to $V_{CGR}$ for a read operation or to a verify level for a verify operation. In this case, the sense amplifier holds the bit line voltage constant regardless of what the NAND sting is doing, so the sense amplifier measures the current flowing with the bit line "clamped" to that voltage. At some point after t1 and prior to t3 (as determined by the particular implementation), the sense amplifier will determine whether the capacitor in the sense amplifier has dissipated a sufficient amount. At t3, the depicted waveforms will be lowered to Vss (or another value for standby or recovery). Note that in other embodiments, the timing of some of the waveforms can be changed.

The process depicted in FIG. 8 can be repeated at the next read or verify level, in which a different $V_{CGR}$ is applied to sense whether the $V_{TH}$ of the storage elements associated with the selected word line is above or below a corresponding compare point.

Figure 9:
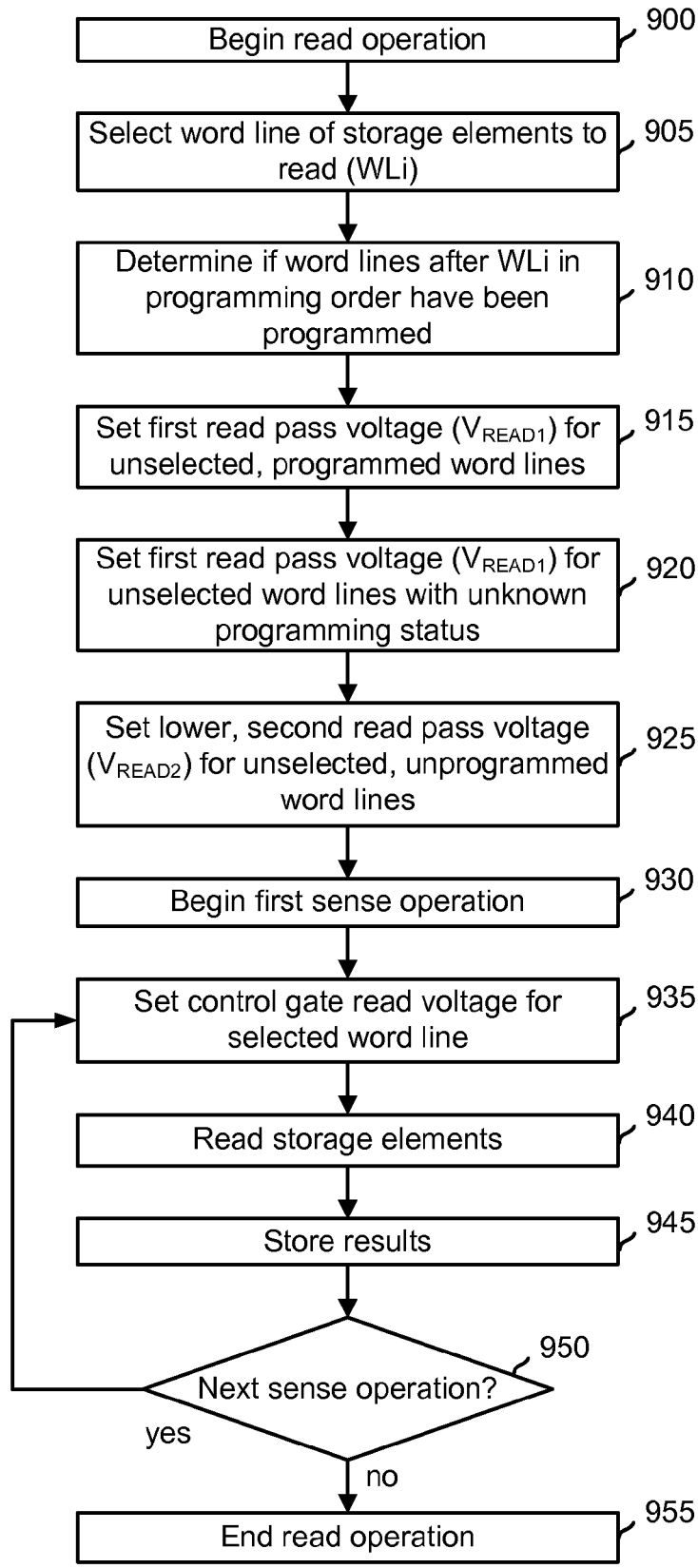
FIG. 9 depicts a flowchart of a process for setting voltages applied to a set of word lines during a read operation.

FIG. 9 depicts a flowchart of a process for setting voltages applied to a set of word lines during a read operation. At step 900, a read operation begins. Step 905 includes selecting a word line of storage elements to read, e.g., WLi. Step 910 includes determining if word lines after WLi in programming order have been programmed, e.g., by reading a programming status flag associated with one or more of the word lines, accessing data stored in a memory used by a control, performing a pre-read operation, or via another technique. Step 915 includes setting a first read pass voltage $V_{READ1}$ for the unselected, programmed word lines and step 920 includes setting the first read pass voltage $V_{READ1}$ for the unselected word lines with an unknown programming status. Step 925 includes setting a second read pass voltage $V_{READ2}$ for the unselected, unprogrammed word lines, where $V_{READ2} < V_{READ1}$. Step 930 includes beginning a first sense operation. Step 935 includes setting a control gate read voltage for the selected word line. Step 940 includes reading one or more storage elements and step 945 includes storing the results, e.g., indicating whether or not the threshold voltage of the storage element is greater than a read compare voltage. If there is a next sense operation, at decision step 950, processing at steps 935-945 is repeated. For example, the first sense operation may use the read compare value Vra, a second sense operation may use the read compare value Vrb, and a third sense operation may use the read compare value Vrc (see FIG. 16). The read operation ends at step 955.

FIG. 10a depicts a flowchart of a first process for determining whether unselected word lines in a set of word lines have been programmed. As mentioned, one approach involves determining if a word line in a predetermined position in a set of word lines has been programmed. Specifically, step 1000 includes beginning a process to determine if word lines after a selected word line WLi in a programming order have been programmed. Step 1002 includes determining if a word line WLx at a predetermined position in a set of n word lines, after WLi in programming order, has been programmed. In one example mentioned previously in connection with FIG. 6, n=32 word lines and WLx=WL23. The determination at step 1002 can involve reading the storage elements on WLx or reading a previously set status flag, for instance (step 1004). If it is determined that WLx is programmed at decision step 1006, and no further programming status checks are to be made, at decision step 1008, a first read pass voltage $V_{READ1}$ is set for the unselected, programmed word lines WL0 through WLi−1 and WLi+1 through WLx at step 1018, and for the unselected word lines with unknown programming status, WLx+1 though WLn−1 at step 1020. That is, $V_{READ1}$ is used for all of the unselected word lines. For example, with WLi=WL3 and WLx=WL23, step 1018 involves setting $V_{READ1}$ for WL0 through WL2 and WL4 through WL23, and step 1020 involves setting $V_{READ1}$ for WL24 through WL31.

If another programming status check is to be performed at decision step 1008, processing proceeds at step 1002, where it is determined whether a new word line WLx (for a different value of x) has been programmed. As an example, WLx=WL23 the first pass and WLx=WL27 the second pass. If the newly checked word line is programmed, at step 1006, and no further check is made at step 1008, steps 1018 and 1020 are performed as discussed. For example, with WLi=WL3 and WLx=WL27, step 1018 involves setting $V_{READ1}$ for WL0 through WL2 and WL4 through WL27, and step 1020 involves setting $V_{READ1}$ for WL28 through WL31.

If the checked word line is not programmed at step 1006, steps 1012-1016 are performed. Step 1012 includes setting $V_{READ1}$ for the unselected, programmed word lines WL0 through WLi−1, step 1014 includes setting $V_{READ1}$ for the unselected word lines with unknown programming status, WLi+1 through WLx−1, and step 1016 includes setting the lower, second read pass voltage $V_{READ2}$ for the unselected, unprogrammed word lines WLx through WLn−1. For example, with WLi=WL3 and WLx=WL23, step 1012 involves setting $V_{READ1}$ for WL0 through WL2, step 1014 involves setting $V_{READ1}$ for WL4 through WL22 and step 1016 involves setting $V_{READ2}$ for WL23 through WL31.

Generally, programming status checks can be made for word lines starting from a word line (e.g., WL23) which is closer to the selected word line (e.g., WL3) in programming order and proceeding to a word line (e.g., WL27) which is further from the selected word line until an unprogrammed word line, if any, is reached. The reverse approach is also possible, e.g., performing programming status checks starting from a word line (e.g., WL27) which is further from the selected word line (e.g., WL3) in programming order and proceeding to a word line (e.g., WL23) which is closer to the selected word line until an unprogrammed word line, if any, is reached.

FIG. 10b depicts a flowchart of a second process for determining whether unselected word lines in a set of word lines have been programmed. This approach involves performing a programming status check on a word line which is determined based on a position of the selected word line in a set of word lines. Specifically, step 1040 includes beginning a process to determine if word lines after a selected word line WLi in a programming order have been programmed. Step 1042 sets a variable k to a constant. Step 1044 includes determining if a word line WLi+k, which is k word lines after WLi in programming order, has been programmed. For example, n=32 word lines, WLi=WL3 and k=8. In this case, step 1044 involves determining if WL11 has been programmed. The determination at step 1044 can involve reading the storage elements on WL11 or reading a previously set status flag, for instance (step 1046). If it is determined that WLi+k is programmed at decision step 1048, and no further programming status checks are to be made, at decision step 1050, a first read pass voltage $V_{READ1}$ is set for the unselected, programmed word lines WL0 through WLi−1 and WLi+1 through WLi+k at step 1062 and for the unselected word lines with unknown programming status, WLi+k+1 though WLn−1 at step 1064. That is, $V_{READ1}$ is used for all of the unselected word lines. For example, with WLi=WL3 and k=8, step 1062 involves setting $V_{READ1}$ for WL0 through WL2 and WL4 through WL11, and step 1064 involves setting $V_{READ1}$ for WL12 through WL31.

If another programming status check is to be performed at decision step 1050, the variable k is incremented by the constant at step 1052. For example, with k=8 at step 1042, k=16 at step 1052. At decision step 1054, if k does not exceed the last word line (or some other specified word line near the last word line, for instance), steps 1044 and 1046 are repeated with the new value of k. Thus, the programming status of a new word line which is k word lines away from the previously checked word line is evaluated. For example, the programming status of WL19 may be checked when k=16 and WLi=WL3. If the newly checked word line is not programmed at step 1048, steps 1056-1060 are performed. Step 1056 includes setting $V_{READ1}$ for the unselected, programmed word lines WL0 through WLi−1, step 1058 includes setting $V_{READ1}$ for the unselected word lines with unknown programming status, WLi+1 through WLi+k−1, and step 1060 includes setting the lower, second read pass voltage $V_{READ2}$ for the unselected, unprogrammed word lines WLi+k through WLn−1. For example, with WLi=WL3 and WLi+k=WL19, step 1056 involves setting $V_{READ1}$ for WL0 through WL2, step 1058 involves setting $V_{READ1}$ for WL4 through WL18 and step 1060 involves setting $V_{READ2}$ for WL19 through WL31.

FIG. 10c depicts a flowchart of a third process for determining whether unselected word lines in a set of word lines have been programmed. This approach involves performing a programming status check on a word line which is determined based on a position of the selected word line in a set of word lines and a number of word lines in the set of word lines. Essentially, the increment for checking word line programming status is expressed as a fraction of the number of word lines between the selected word line and the last word line.

Specifically, step 1070 includes beginning a process to determine if word lines after a selected word line WLi in a programming order have been programmed. Step 1072 sets a variable k=(n−i)/constant. For example, with WLi=3, and n=32, and constant=3, k=(32−3)/3=9.6. This value is rounded to the nearest integer, e.g., 10. Step 1074 includes determining if a word line WLi+k, which is k word lines after WLi in programming order, has been programmed. For example, WLi=WL3 and k=10. In this case, step 1074 involves determining if WL13 has been programmed. The determination at step 1074 can involve reading the storage elements on WL13 or reading a previously set status flag, for instance (step 1076). If it is determined that WLi+k is programmed at decision step 1078, and no further programming status checks are to be made, at decision step 1080, $V_{READ1}$ is set for the unselected, programmed word lines WL0 through WLi−1 and WLi+1 through WLi+k at step 1092, and for the unselected word lines with unknown programming status, WLi+k+1 though WLn−1 at step 1094. That is, $V_{READ1}$ is used for all of the unselected word lines. For example, with WLi=WL3 and k=10, step 1092 involves setting $V_{READ1}$ for WL0 through WL2 and WL4 through WL13, and step 1094 involves setting $V_{READ1}$ for WL14 through WL31.

If another programming status check is to be performed at decision step 1080, the variable k is incremented at step 1082. For example, with k=10 at step 1072, k=20 at step 1082. At decision step 1084, if k does not exceed the last word line (or some other specified word line near the last word line, for instance), steps 1074 and 1076 are repeated with the new value of k. Thus, the programming status of a new word line which is k word lines away from the previously checked word line is evaluated. For example, the programming status of WL23 may be checked when k=20 and WLi=WL3. If the newly checked word line is not programmed at step 1078, steps 1086-1090 are performed. Step 1086 includes setting $V_{READ1}$ for the unselected, programmed word lines WL0 through WLi−1, step 1088 includes setting $V_{READ1}$ for the unselected word lines with unknown programming status, WLi+1 through WLi+k−1, and step 1090 includes setting the lower, second read pass voltage $V_{READ2}$ for the unselected, unprogrammed word lines WLi+k through WLn−1. For example, with WLi=WL3 and WLi+k=WL23, step 1086 involves setting $V_{READ1}$ for WL0 through WL2, step 1088 involves setting $V_{READ1}$ for WL4 through WL22 and step 1090 involves setting $V_{READ2}$ for WL23 through WL31.

If another pass is made through step 1082, k is next incremented to 30.

Various other techniques can be used for choosing word lines for programming status checks. For example, the increment between chosen word lines need not be constant but can vary. As an example, larger increments can be used initially to try to locate an unprogrammed word line. Then, smaller increments can be used. Further, the direction of the increment can be toward and/or away from the selected word line. For example, with WL3 as the selected word line and n=32 word lines, the first chosen word line can be WL23, followed by WL8 if WL23 is unprogrammed, followed by WL16 if WL8 is programmed, for instance. That is, if WL23 is unprogrammed, it may be desirable to try to locate the first unprogrammed word line, or an unprogrammed word line closer to the first unprogrammed word line. In this case, WL8 is selected as a word line which is closer to WL3 than WL23. However, if it turns out that this is too aggressive, e.g., WL8 turns out to be programmed, then the technique backs off by checking WL16, which is between WL8 and WL23. This approach attempts to converge on the first unprogrammed word line. Depending on the degree of accuracy desired and the amount of overhead which can be accommodated, the first unprogrammed word line can be determined exactly or to a desired degree of accuracy, e.g., within a few word lines.

Figure 10D:
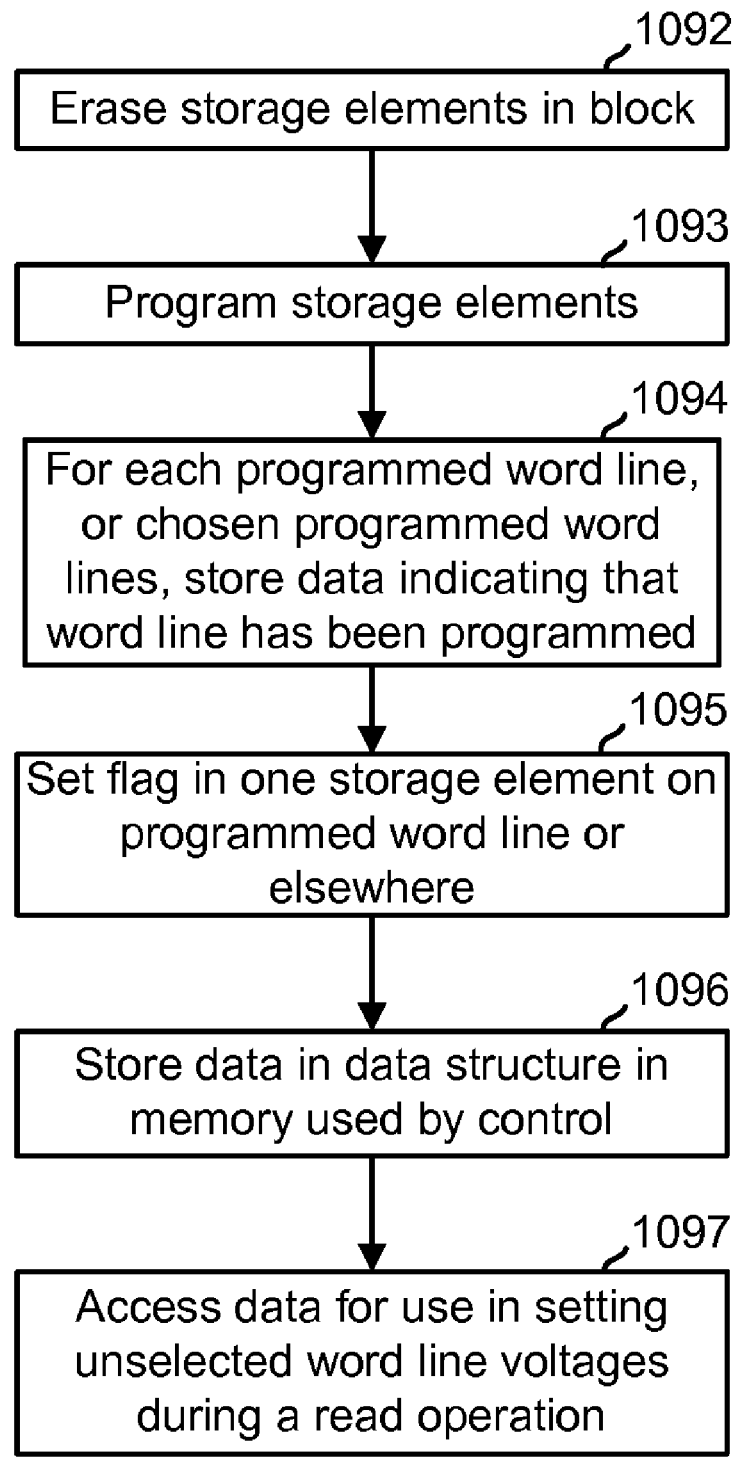
FIG. 10d depicts a flowchart of a process for storing data indicating whether a word line has been programmed.

FIG. 10d depicts a flowchart of a process for storing data indicating whether a word line has been programmed. A typically sequence of events in the erasing and programming of non-volatile storage is depicted. Step 1092 depicts the erasure of storage elements in a block or other set of storage elements. Step 1093 depicts the programming of storage elements. At step 1094, for each programmed word line, or for chosen programmed word lines, data is stored indicating that the word line has been programmed. For example, this can include setting a flag in one (or more) storage elements on the programmed word line or elsewhere (step 1095), e.g., in another storage element in another word line in the set of word lines or in a storage element in another set of words lines. Or, data can be stored in a data structure in a memory used by the control, e.g., in the form: WL=x, flag=programmed (step 1096). At step 1097, the data is subsequently accessed for use in setting optimal unselected word line voltages during a read or other sense operation, as discussed.

Figure 11:
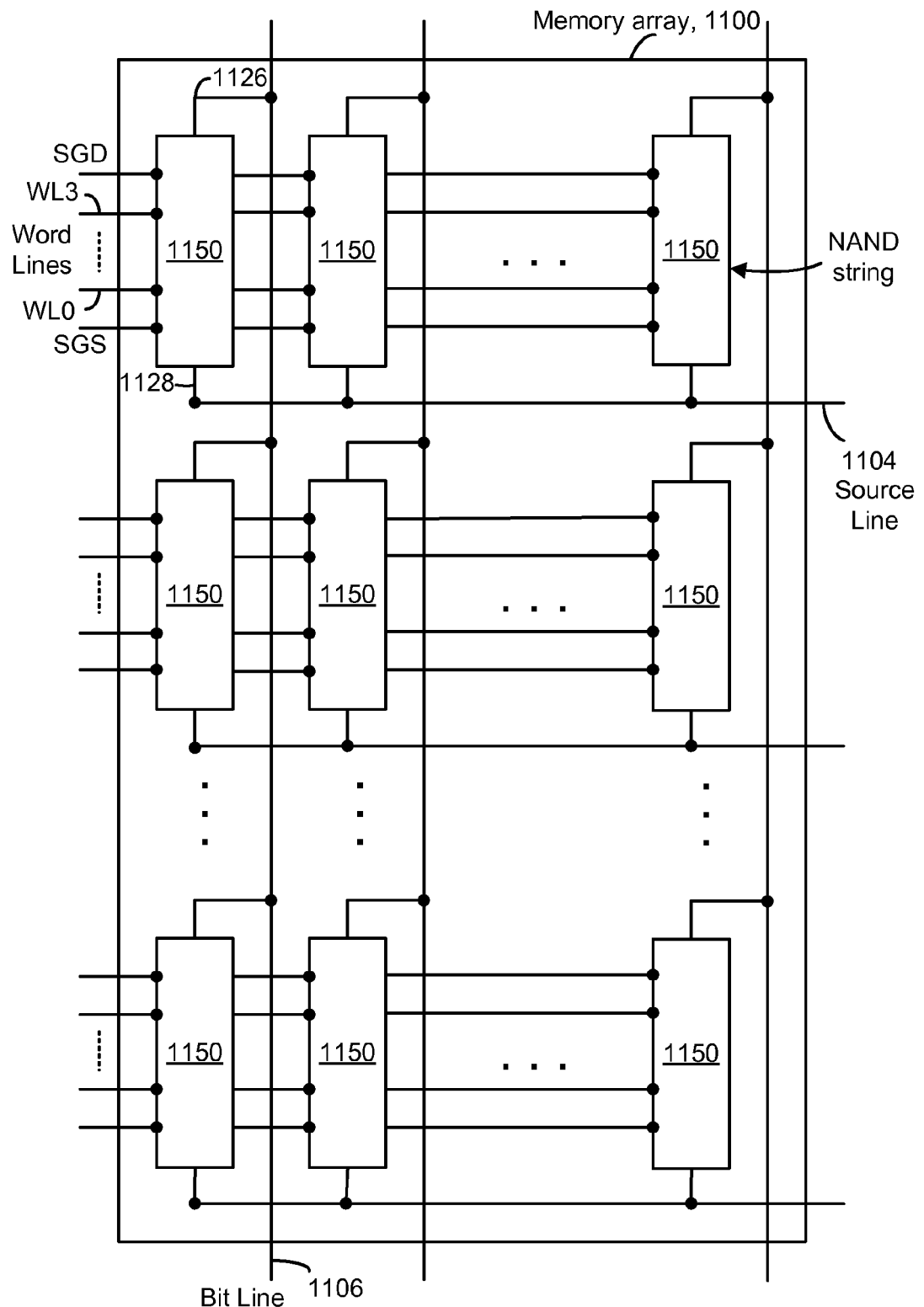
FIG. 11 is a block diagram of an array of NAND flash storage elements.

FIG. 11 illustrates an example of an array 1100 of NAND storage elements, such as those shown in FIGS. 1 and 2. Along each column, a bit line 1106 is coupled to the drain terminal 1126 of the drain select gate for the NAND string 1150. Along each row of NAND strings, a source line 1104 may connect all the source terminals 1128 of the source select gates of the NAND strings. An example of a NAND architecture array and its operation as part of a memory system is found in U.S. Pat. Nos. 5,570,315; 5,774,397; and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 20 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 12:
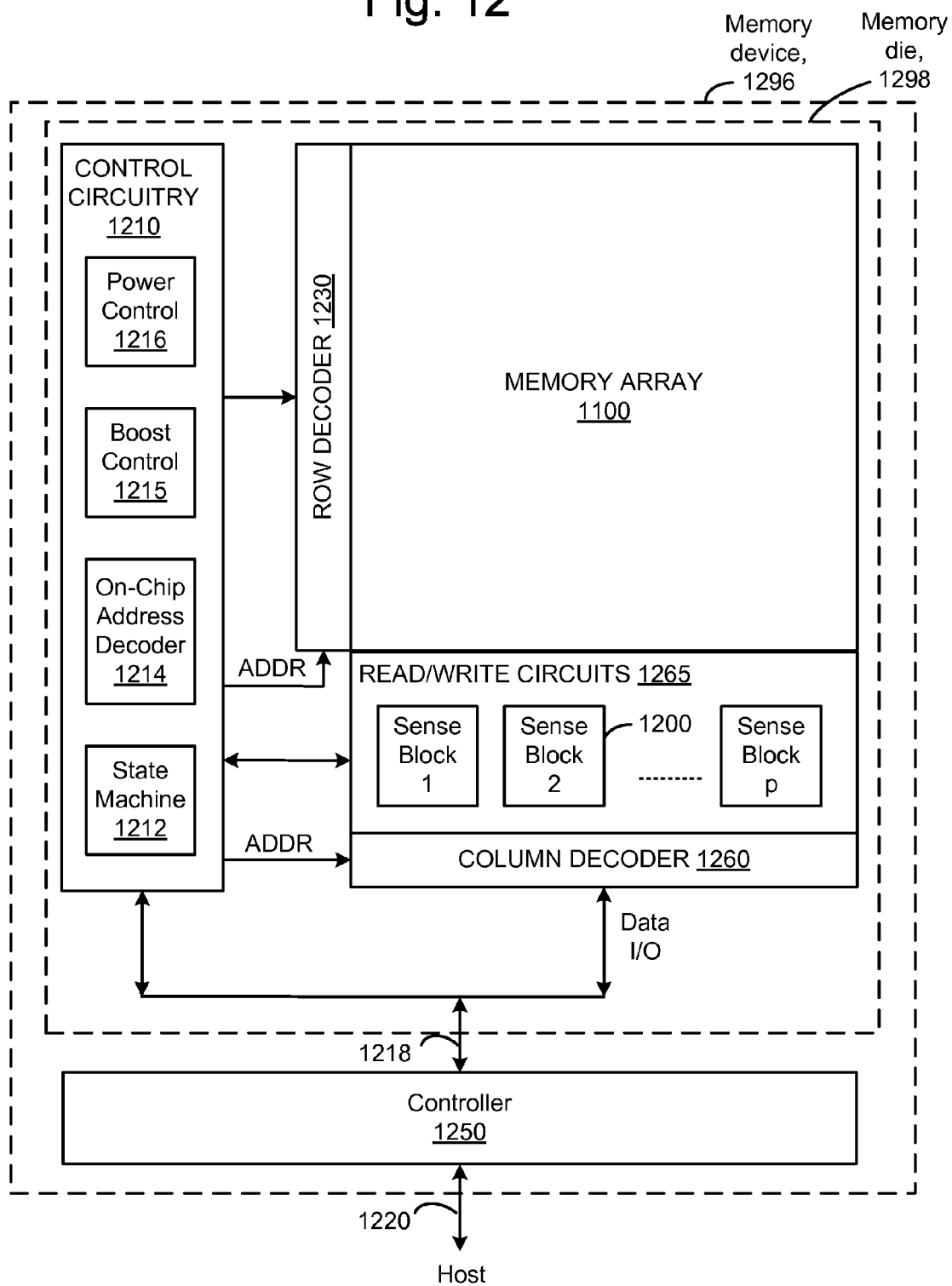
FIG. 12 is a block diagram of a non-volatile memory system using single row/column decoders and read/write circuits.

FIG. 12 is a block diagram of a non-volatile memory system using single row/column decoders and read/write circuits. The diagram illustrates a memory device 1296 having read/write circuits for reading and programming a page of storage elements in parallel, according to one embodiment of the present invention. Memory device 1296 may include one or more memory die 1298. Memory die 1298 includes a two-dimensional array of storage elements 1100, control circuitry 1210, and read/write circuits 1265. In some embodiments, the array of storage elements can be three dimensional. The memory array 1100 is addressable by word lines via a row decoder 1230 and by bit lines via a column decoder 1260. The read/write circuits 1265 include multiple sense blocks 1200 and allow a page of storage elements to be read or programmed in parallel. Typically a controller 1250 is included in the same memory device 1296 (e.g., a removable storage card) as the one or more memory die 1298. Commands and Data are transferred between the host and controller 1250 via lines 1220 and between the controller and the one or more memory die 1298 via lines 1218.

The control circuitry 1210 cooperates with the read/write circuits 1265 to perform memory operations on the memory array 1100. The control circuitry 1210 includes a state machine 1212, an on-chip address decoder 1214, a boost control 1215 and a power control module 1216. The state machine 1212 provides chip-level control of memory operations. The on-chip address decoder 1214 provides an address interface between that used by the host or a memory controller to the hardware address used by the decoders 1230 and 1260. The boost control 1215 can be used for setting a boost mode, including determining a timing for initiating source side and drain side boosting, as discussed herein. The power control module 1216 controls the power and voltages supplied to the word lines and bit lines during memory operations.

In some implementations, some of the components of FIG. 12 can be combined. In various designs, one or more of the components (alone or in combination), other than storage element array 1100, can be thought of as a managing circuit. For example, one or more managing circuits may include any one of or a combination of control circuitry 1210, state machine 1212, decoders 1214/1260, power control 1216, sense blocks 1200, read/write circuits 1265, controller 1250, etc.

Figure 13:
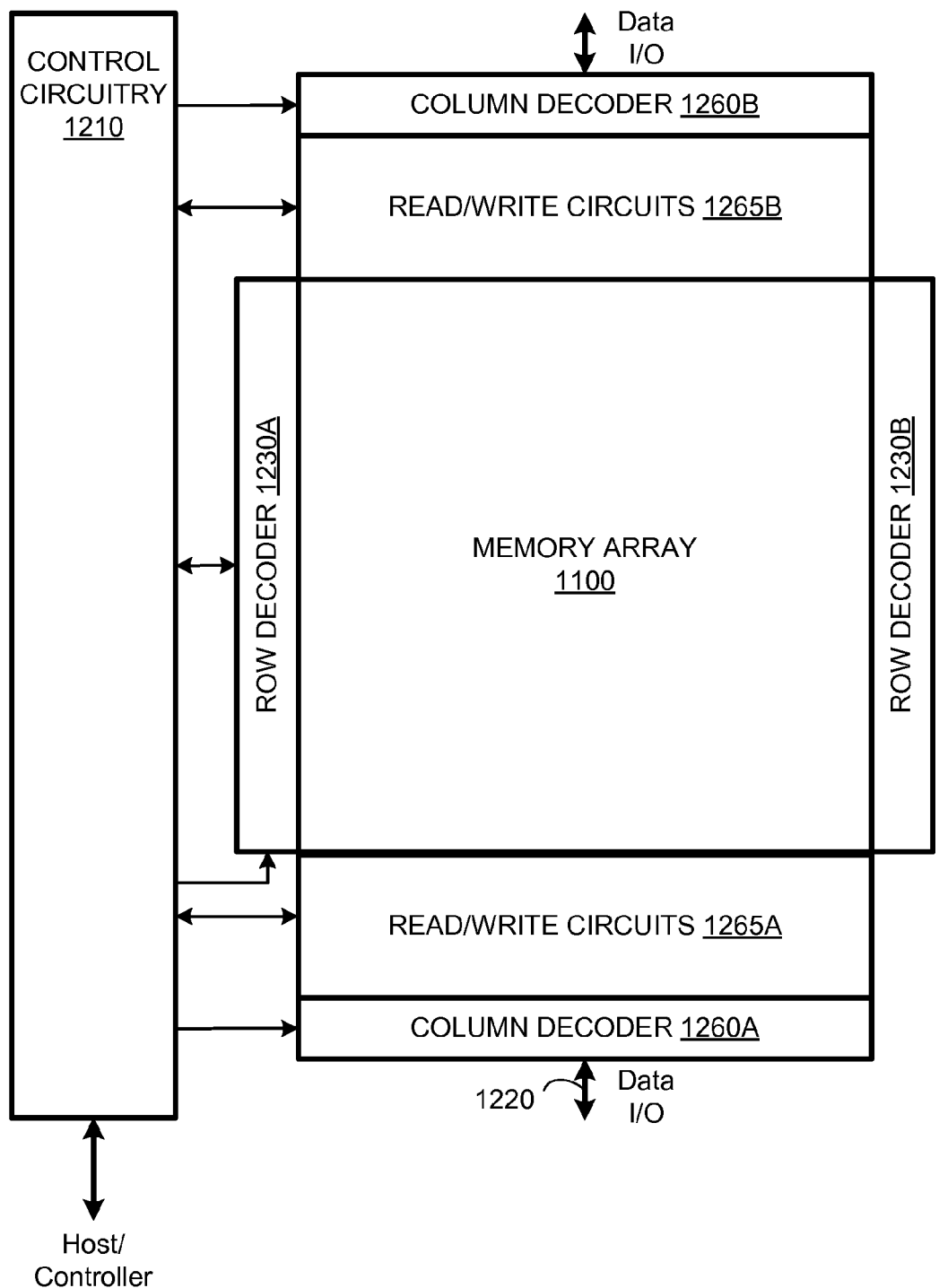
FIG. 13 is a block diagram of a non-volatile memory system using dual row/column decoders and read/write circuits.

FIG. 13 is a block diagram of a non-volatile memory system using dual row/column decoders and read/write circuits. Here, another arrangement of the memory device 1296 shown in FIG. 12 is provided. Access to the memory array 1100 by the various peripheral circuits is implemented in a symmetric fashion, on opposite sides of the array, so that the densities of access lines and circuitry on each side are reduced by half. Thus, the row decoder is split into row decoders 1230A and 1230B and the column decoder into column decoders 1260A and 1260B. Similarly, the read/write circuits are split into read/write circuits 1265A connecting to bit lines from the bottom and read/write circuits 1265B connecting to bit lines from the top of the array 1100. In this way, the density of the read/write modules is essentially reduced by one half. The device of FIG. 13 can also include a controller, as described above for the device of FIG. 12.

Figure 14:
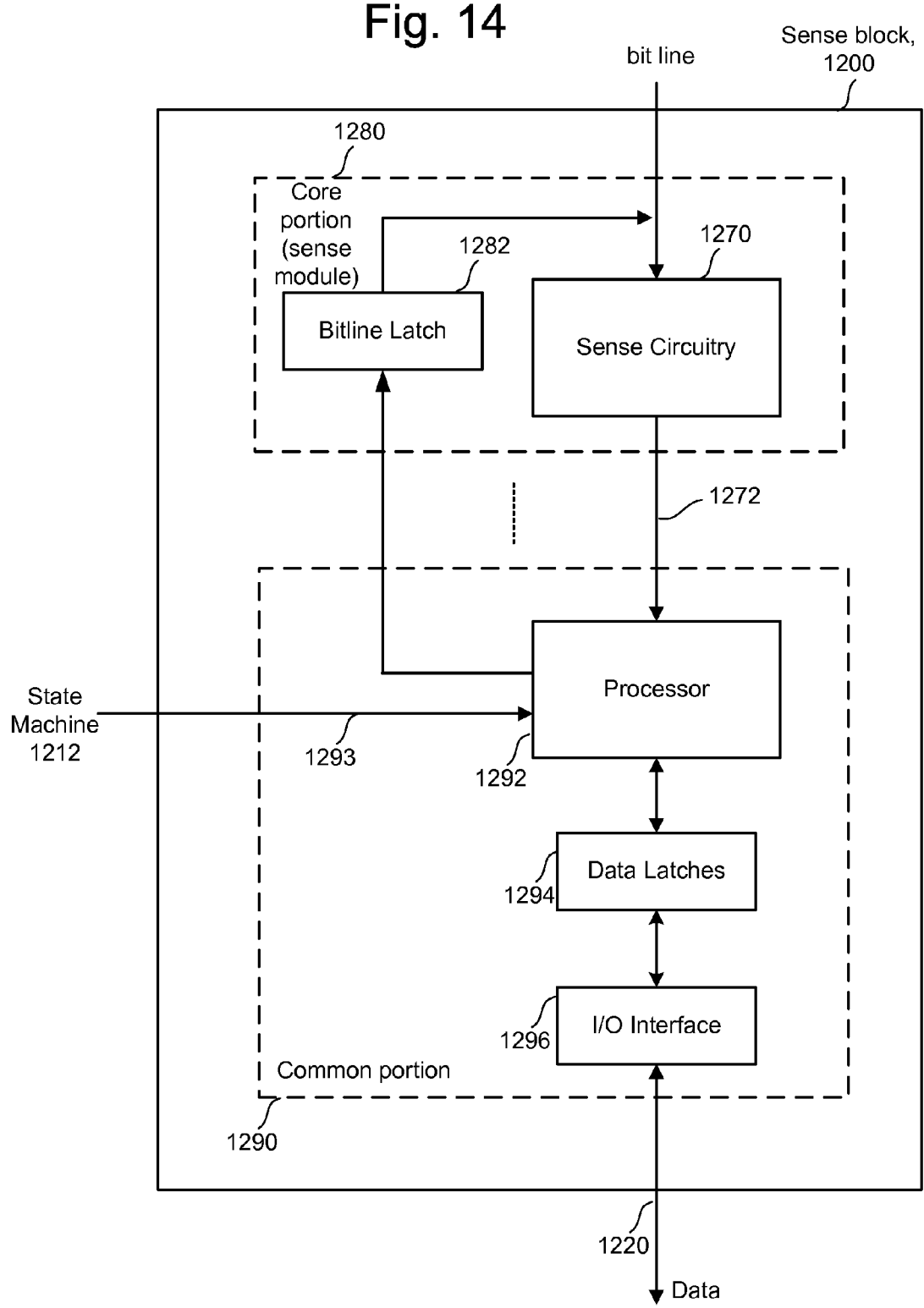
FIG. 14 is a block diagram depicting one embodiment of a sense block.

FIG. 14 is a block diagram depicting one embodiment of a sense block. An individual sense block 1200 is partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details refer to U.S. Patent Application Pub No. 2006/0140007, titled "Non-Volatile Memory and Method with Shared Processing for an Aggregate of Sense Amplifiers" published Jun. 29, 2006, and incorporated herein by reference in its entirety.

Sense module 1280 comprises sense circuitry 1270 that determines whether a conduction current in a connected bit line is above or below a predetermined threshold level. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., $V_{dd}$).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed storage element and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1212 that controls the supply of different control gate voltages to the addressed storage element. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1292 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1294 from the data bus 1220. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1292 monitors the read back memory state relative to the desired memory state. When the two are in agreement, the processor 1292 sets the bit line latch 1282 so as to cause the bit line to be pulled to a state designating program inhibit. This inhibits the storage element coupled to the bit line from further programming even if programming pulses appear on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are three data latches per sense module 1280. In some implementations (but not required), the data latches are implemented as a shift register so that the parallel data stored therein is converted to serial data for data bus 1220, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Pat. No. 7,196,931, issued Mar. 27, 2007, titled "Non-Volatile Memory And Method With Reduced Source Line Bias Errors"; (2) U.S. Pat. No. 7,023, 736, issued Apr. 4, 2006, titled "Non-Volatile Memory And Method with Improved Sensing"; (3) U.S. Pat. No. 7,046, 568, issued May 16, 2006, titled "Memory Sensing Circuit And Method For Low Voltage Operation"; (4) U.S. Patent Application Pub. 2006/0221692, published Oct. 5, 2006, titled "Compensating for Coupling During Read Operations of Non-Volatile Memory"; and (5) U.S. Patent Application Pub. No. 2006/0158947, published Jul. 20, 2006, titled "Reference Sense Amplifier For Non-Volatile Memory." All five of the immediately above-listed patent documents are incorporated herein by reference in their entirety.

Figure 15:
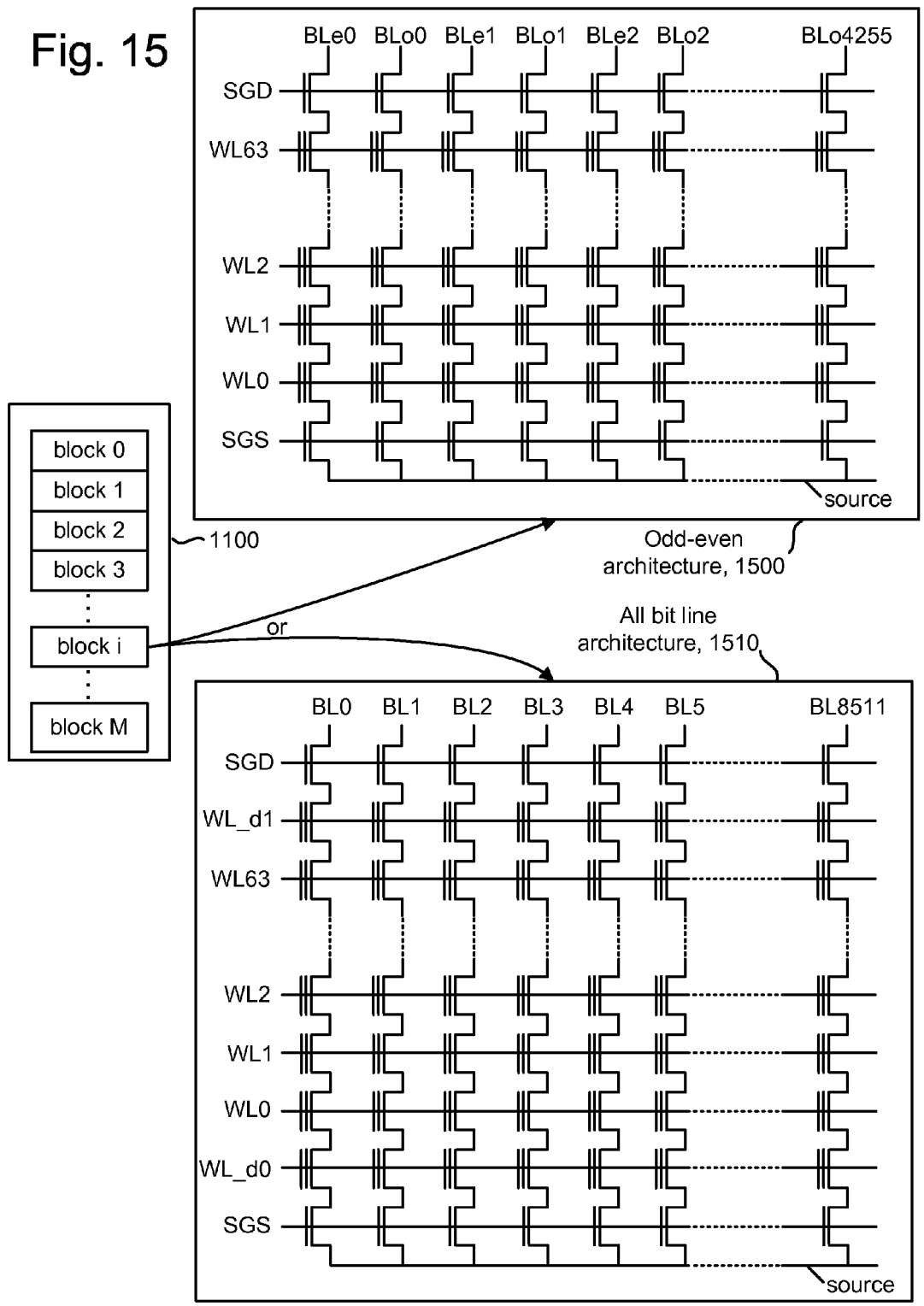
FIG. 15 illustrates an example of an organization of a memory array into blocks for an all bit line memory architecture or for an odd-even memory architecture.

FIG. 15 illustrates an example of an organization of a memory array into blocks for an all bit line memory architecture or for an odd-even memory architecture. Exemplary structures of memory array 1500 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 1510), all the bit lines of a block can be simultaneously selected during read and program operations. Storage elements along a common word line and connected to any bit line can be programmed at the same time.

In the example provided, 64 storage elements and two dummy storage elements are connected in series to form a NAND string. There are sixty four data word lines and two dummy word lines, WL-d0 and WL-d1, where each NAND string includes sixty four data storage elements and two dummy storage elements. In other embodiments, the NAND strings can have more or less than 64 data storage elements and two dummy storage elements. Data memory cells can store user or system data. Dummy memory cells are typically not used to store user or system data.

One terminal of the NAND string is connected to a corresponding bit line via a drain select gate (connected to select gate drain lines SGD), and another terminal is connected to c-source via a source select gate (connected to select gate source line SGS).

In one embodiment, referred to as an odd-even architecture (architecture 1500), the bit lines are divided into even bit lines (BLe) and odd bit lines (BLo). In this case, storage elements along a common word line and connected to the odd bit lines are programmed at one time, while storage elements along a common word line and connected to even bit lines are programmed at another time. Data can be programmed into different blocks and read from different blocks concurrently. In each block, in this example, there are 8,512 columns that are divided into even columns and odd columns.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5 to 4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. A lower $V_{READ}$ can be used for some word lines, as discussed. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

Figure 16:
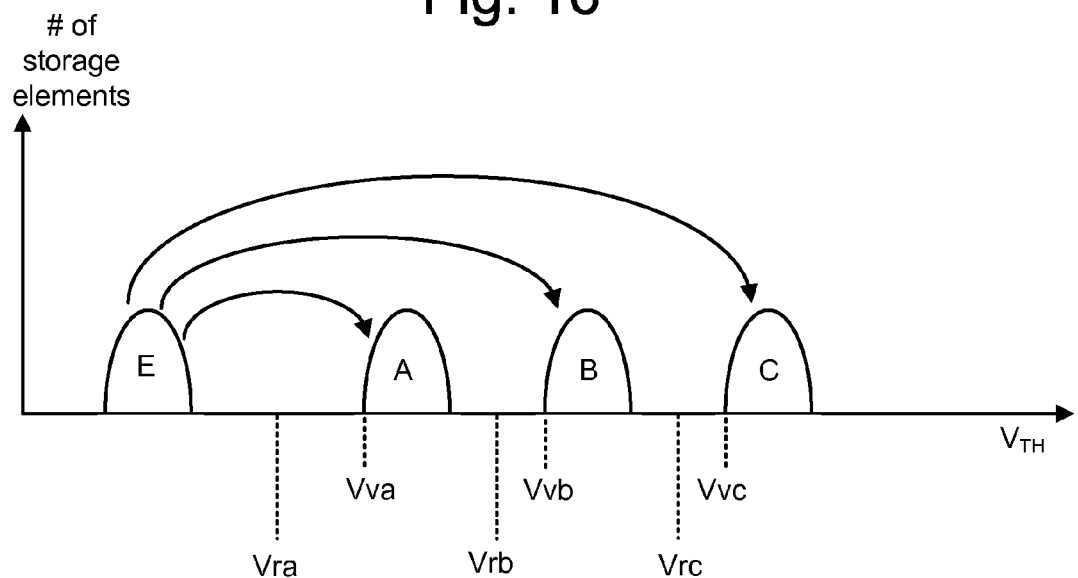
FIG. 16 depicts an example set of threshold voltage distributions with single pass programming.

FIG. 16 depicts an example set of threshold voltage distributions. Example $V_{TH}$ distributions for the storage element array are provided for a case where each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Patent Application Publication No. 2004/0255090, published Dec. 16, 2004, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or fewer than four states.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. Additional read and reference values can be used when the storage elements store additional states. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequence of FIG. 20 will then be used to program storage elements directly into states A, B or C. While some storage elements are being programmed from state E to state A, other storage elements are being programmed from state E to state B and/or from state E to state C. When programming from state E to state C on a selected word line, WLi, the amount of parasitic coupling to the adjacent floating gate under WLi−1 is a maximized since the change in amount of charge on the floating gate under WLi is largest as compared to the change in voltage when programming from state E to state A or state E to state B. When programming from state E to state B the amount of coupling to the adjacent floating gate is reduced but still significant. When programming from state E to state A the amount of coupling is reduced even further. Consequently the amount of correction required to subsequently read each state of WLi−1 will vary depending on the state of the adjacent storage element on WLi.

Figure 17:
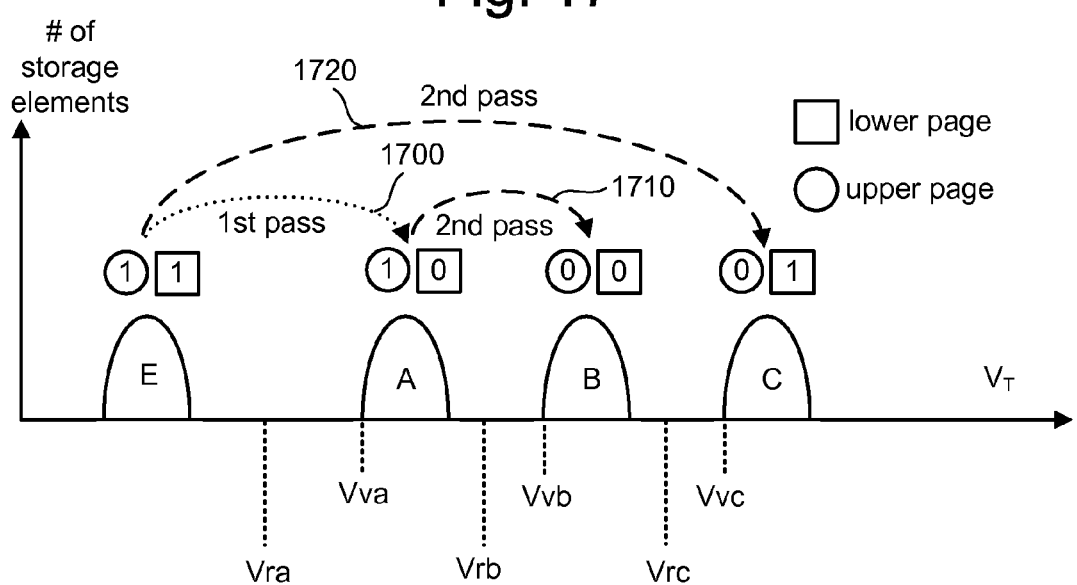
FIG. 17 depicts an example set of threshold voltage distributions with multi-pass programming.

FIG. 17 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 1100. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 1720. If the storage element had been programmed into state A as a result of the first programming pass, then the storage element is further programmed in the second pass so that the threshold voltage is increased to be within state B, as depicted by arrow 1710. The result of the second pass is to program the storage element into the state designated to store a logic "0" for the upper page without changing the data for the lower page. In both FIG. 16 and FIG. 17, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Patent Application Pub. No. 2006/0126390, titled "Pipelined Programming of Non-Volatile Memories Using Early Data," published Jun. 15, 2006, incorporated herein by reference in its entirety.

Figure 18A:
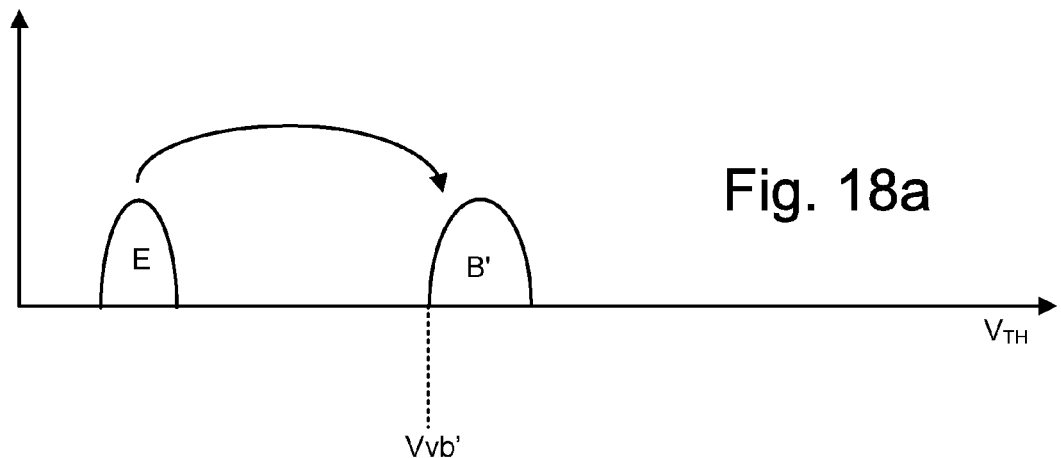
FIGS. 18a-c show various threshold voltage distributions and describe a process for programming non-volatile memory.
Figure 18B:
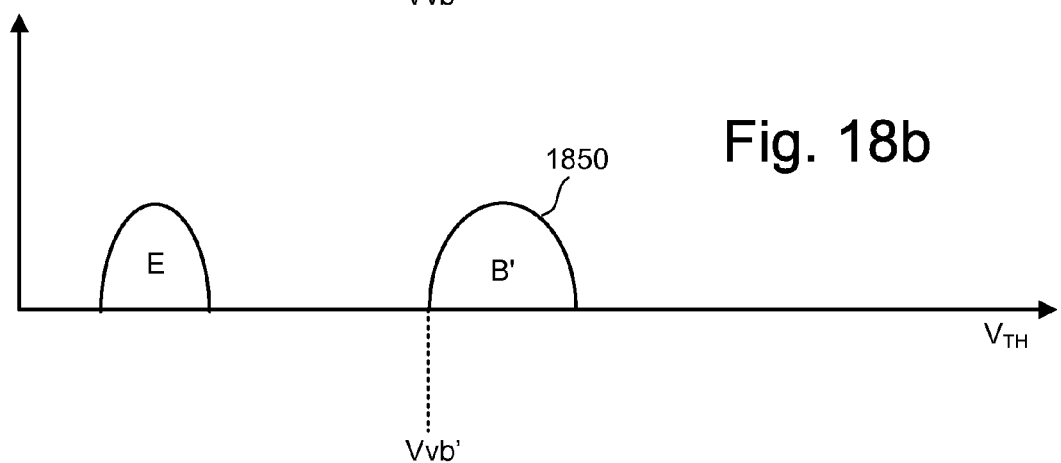
Figure 18C:
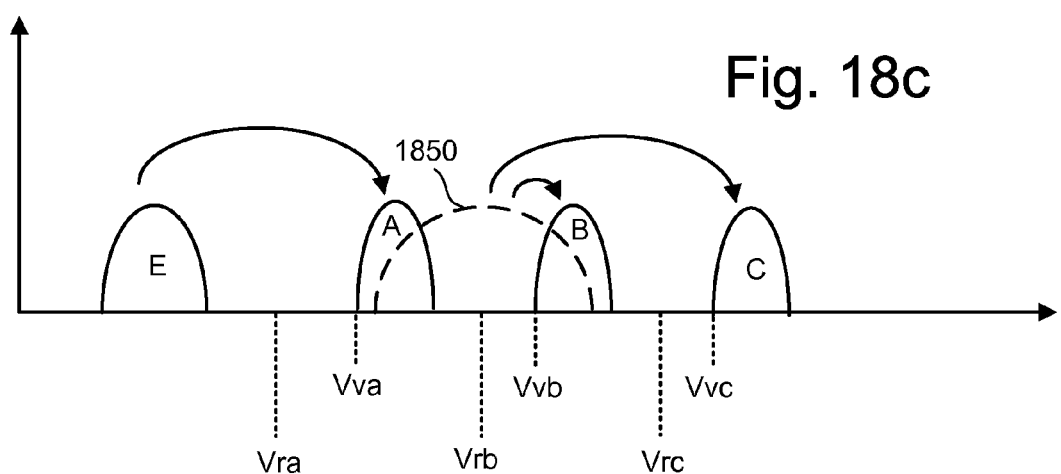

FIGS. 18*a-c* disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 18*a* therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 1850 of FIG. 18*b*. This apparent widening of the threshold voltage distribution will be remedied when programming the upper page.

FIG. 18*c* depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 1850 and the upper page data is to remain at 1, then the storage element will be programmed to final state B. If the storage element is in intermediate threshold voltage distribution 1850 and the upper page data is to become data 0, then the threshold voltage of the storage element will be raised so that the storage element is in state C. The process depicted by FIGS. 18*a-c* reduces the effect of floating gate to floating gate coupling because only the upper page programming of neighbor storage elements will have an effect on the apparent threshold voltage of a given storage element. An example of an alternate state coding is to move from distribution 1850 to state C when the upper page data is a 1, and to move to state B when the upper page data is a 0.

Although FIGS. 18*a-c* provide an example with respect to four data states and two pages of data, the concepts taught can be applied to other implementations with more or fewer than four states and different than two pages.

Figure 19:
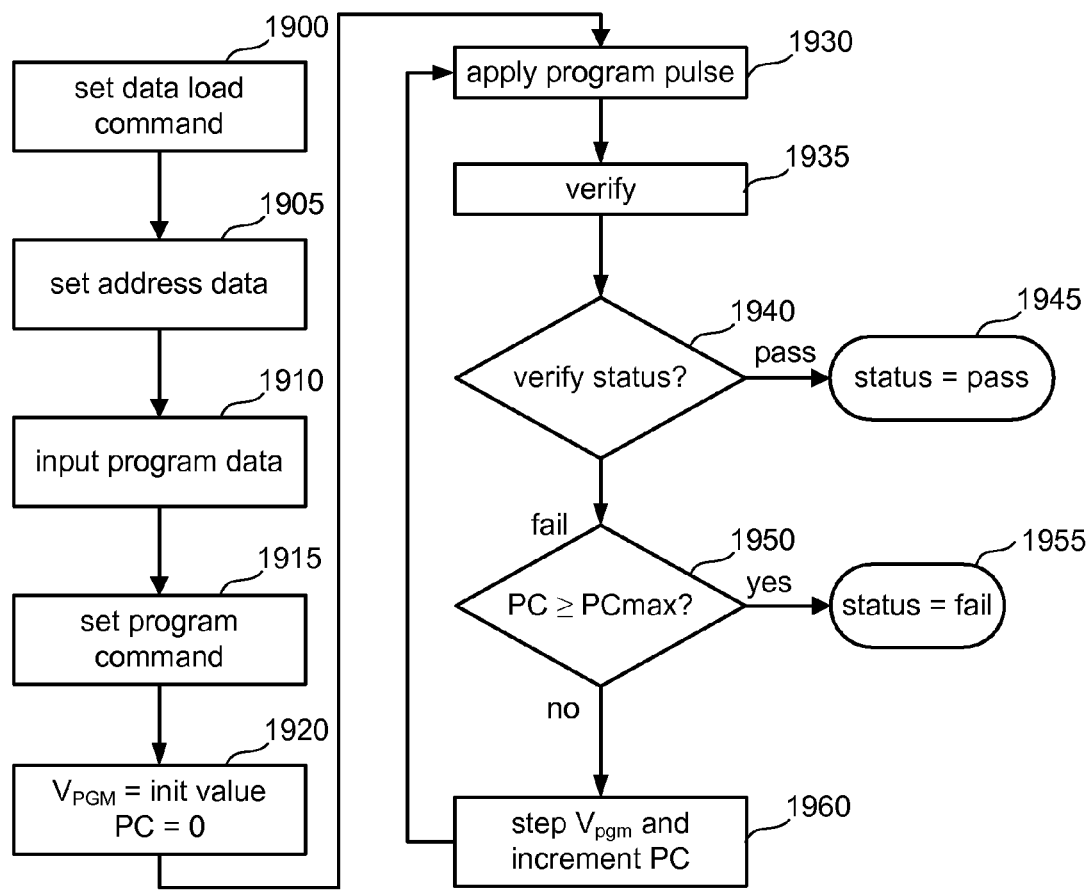
FIG. 19 is a flow chart describing one embodiment of a process for programming non-volatile memory.

FIG. 19 is a flow chart describing one embodiment of a method for programming non-volatile memory. In one implementation, storage elements are erased (in blocks or other units) prior to programming. In step 1900, a "data load"

command is issued by the controller and input received by control circuitry 1210. In step 1905, address data designating the page address is input to decoder 1214 from the controller or host. In step 1910, a page of program data for the addressed page is input to a data buffer for programming. That data is latched in the appropriate set of latches. In step 1915, a "program" command is issued by the controller to state machine 1212.

Figure 20:
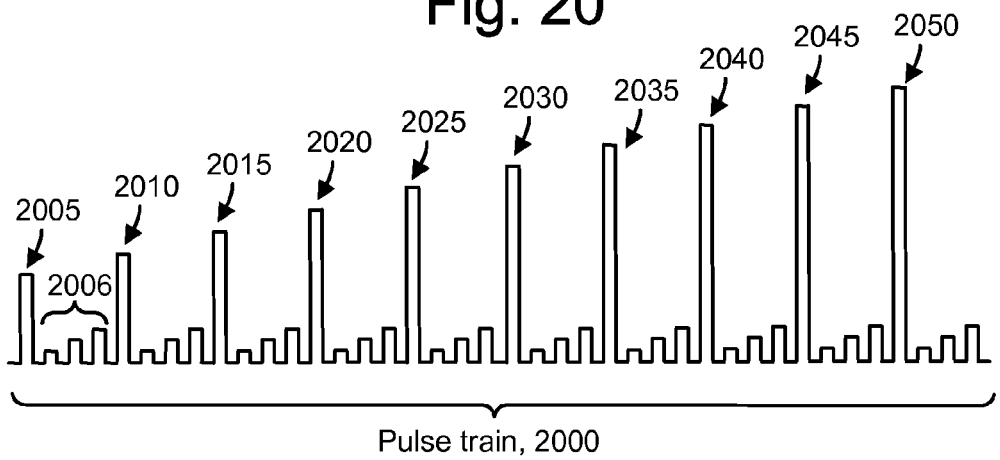
FIG. 20 depicts an example pulse train applied to the control gates of non-volatile storage elements during programming.

Triggered by the "program" command, the data latched in step 1910 will be programmed into the selected storage elements controlled by state machine 1212 using the stepped program pulses of the pulse train 2000 of FIG. 20 applied to the appropriate selected word line. In step 1920, the program voltage, $V_{PGM}$, is initialized to the starting pulse (e.g., 12 V or other value) and a program counter (PC) maintained by state machine 1212 is initialized at zero. In step 1930, the first $V_{PGM}$ pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to $V_{dd}$ to inhibit programming.

In step 1935, the states of the selected storage elements are verified. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 1940, a check is made as to whether all of the data latches are storing logic "1." If all of the data latches are storing logic "1," the programming process is complete and successful because all selected storage elements were programmed and verified. A status of "PASS" is reported in step 1945.

If, in step 1940, it is determined that not all of the data latches are storing logic "1," then the programming process continues. In step 1950, the program counter PC is checked against a program limit value PCmax. One example of a program limit value is twenty; however, other numbers can also be used. If the program counter PC is not less than PCmax, then the program process has failed and a status of "FAIL" is reported in step 1955. If the program counter PC is less than PCmax, then $V_{PGM}$ is increased by the step size and the program counter PC is incremented in step 1960. The process then loops back to step 1930 to apply the next $V_{PGM}$ pulse.

FIG. 20 depicts an example pulse train 2000 applied to the control gates of non-volatile storage elements during programming, and a switch in boost mode which occurs during a pulse train. The pulse train 2000 includes a series of program pulses 2005, 2010, 2015, 2020, 2025, 2030, 2035, 2040, 2045, 2050, . . . , that are applied to a word line selected for programming. In one embodiment, the programming pulses have a voltage, $V_{PGM}$, which starts at 12 V and increases by increments, e.g., 0.5 V, for each successive programming pulse until a maximum of 20 V is reached. In between the program pulses are verify pulses. For example, verify pulse set 2006 includes three verify pulses. In some embodiments, there can be a verify pulse for each state that data is being programmed into, e.g., state A, B and C. In other embodiments, there can be more or fewer verify pulses. The verify pulses in each set can have amplitudes of Vva, Vvb and Vvc (FIG. 17) or Vvb' (FIG. 18a), for instance.

As mentioned, the voltages which are applied to word lines to implement a boost mode are applied when programming occurs, e.g., prior to and during a program pulse. In practice, the boost voltages of a boost mode can be initiated slightly before each program pulse and removed after each program pulse. On the other hand, during the verify process, for instance, which occurs between program pulses, the boost voltages are not applied. Instead, read voltages, which are typically less than the boost voltages, are applied to the unselected word lines. The read voltages have an amplitude which is sufficient to maintain the previously programmed storage elements in a NAND string on when the threshold voltage of a currently-programmed storage element is being compared to a verify level.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage system, comprising:
   a set of non-volatile storage elements;
   a set of word lines in communication with the set of non-volatile storage elements; and
   one or more control circuits in communication with the set of non-volatile storage elements and the set of word lines, the one or more control circuits: a) in connection with performing a sense operation on at least one non-volatile storage element associated with a first word line, determine whether or not there is at least one non-volatile storage element associated with a second word line which is in a programmed state, b) apply a first voltage to the second word line while performing the sense operation when the one or more control circuits determine that there is at least one non-volatile storage element associated with the second word line which is in a programmed state, and c) apply a second voltage to the second word line while performing the sense operation when the one or more control circuits determine that there is not at least one non-volatile storage element associated with the second word line which is in a programmed state.

2. The non-volatile storage system of claim 1, wherein: the second voltage is lower than the first voltage.

3. The non-volatile storage system of claim 1, wherein: the one or more control circuits determine whether or not there is at least one non-volatile storage element associated with a second word line which is in a programmed state by applying a voltage to the second word line and determining whether at least one non-volatile storage element associated with the second word line turns on.

4. The non-volatile storage system of claim 1, wherein: the one or more control circuits apply the second voltage to at least one additional word line which is after the second word line in a word line programming order while performing the sense operation, when the one or more control circuits determine that there is not at least one non-volatile storage element associated with the second word line that is in a programmed state.

5. The non-volatile storage system of claim 1, wherein: the one or more control circuits apply the first voltage to a third word line which is before the first word line in a word line programming order while performing the sense operation.

6. The non-volatile storage system of claim 1, wherein: after performing the sense operation, the one or more control circuits perform a second sense operation on at least one non-volatile storage element associated with a third word line while: (a) applying the first voltage to the second word line when the one or more control circuits determine that there is at least one non-volatile storage element associated with the second word line that is in a programmed state, or (b) applying the second voltage to the second word line when the one or more control circuits determine that there is not at least one non-volatile storage element associated with the second word line that is in a programmed state.

7. The non-volatile storage system of claim 1, wherein: the second word line is at predetermined word line position in a set of word lines.

8. The non-volatile storage system of claim 1, wherein: the second word line is at a word line position in a set of word lines which is based on a position of the first word line in the set of word lines.

9. The non-volatile storage system of claim 1, wherein: the sense operation comprises a read operation.

10. The non-volatile storage system of claim 1, wherein: the sense operation comprises a verify operation.

11. The non-volatile storage system of claim 1, wherein: the second word line is after the first word line in a word line programming order.

12. The non-volatile storage system of claim 1, wherein: the one or more control circuits determine whether or not there is at least one non-volatile storage element associated with a second word line which is in a programmed state by accessing data which indicates whether or not there is at least one non-volatile storage element associated with the second word line which is in a programmed state.

13. The non-volatile storage system of claim 12, wherein: the data is stored in at least one non-volatile storage element associated with the second word line.

14. The non-volatile storage system of claim 1, wherein when the one or more control circuits determine that there is at least one non-volatile storage element associated with the second word line that is in a programmed state, the one or more control circuits: d) determine whether or not there is at least one non-volatile storage element associated with a third word line that is in a programmed state, e) apply the first voltage to the third word line while performing the sense operation when it is determined that there is at least one non-volatile storage element associated with the third word line that is in a programmed state, and f) apply the second voltage to the third word line while performing the sense operation when it is determined that there is not at least one non-volatile storage element associated with the third word line that is in a programmed state.

15. The non-volatile storage system of claim 14, wherein: the second word line is after the first word line, and the third word line is after the second word line, in a word line programming order.

16. The non-volatile storage system of claim 14, wherein: the third word line is spaced apart from the second word line by a predetermined number of word lines.

17. The non-volatile storage system of claim 14, wherein: the third word line is at a word line position in a set of word lines which is based on a position of the first word line in the set of word lines.

18. The non-volatile storage system of claim 14, wherein: the first and third word lines are at predetermined word line positions in a set of word lines.

19. A non-volatile storage system, comprising:
a set of non-volatile storage elements;
a set of word lines in communication with the set of non-volatile storage elements; and
one or more control circuits in communication with the set of non-volatile storage elements and the set of word lines, the one or more control circuits: a) determine whether or not a first plurality of word lines includes at least one programmed non-volatile storage element, b) perform a sense operation on at least one non-volatile storage element associated with a first word line, the first word line is not in the first plurality of word lines, c) apply a first voltage to the first plurality of word lines while performing the sense operation when the one or more control circuits determine that the first plurality of word lines includes at least one programmed non-volatile storage element, and d) apply a second voltage to the first plurality of word lines while performing the sense operation when the one or more control circuits determine that the first plurality of word lines does not include at least one programmed non-volatile storage element.

20. The non-volatile storage system of claim 19, wherein: the second voltage is lower than the first voltage.

21. The non-volatile storage system of claim 19, wherein: the one or more control circuits determine whether or not a first plurality of word lines includes at least one programmed non-volatile storage element by determining whether or not a particular word line in the first plurality of word lines which is before remaining word lines in the first plurality of word lines, in a word line programming order, includes at least one programmed non-volatile storage element.

22. The non-volatile storage system of claim 19, wherein: the one or more control circuits apply the first voltage to a second word line while performing the sense operation, the second word line is before the first word line, and the first plurality of word lines is after the first word line, in a word line programming order.

23. The non-volatile storage system of claim 19, wherein: the sense operation comprises a read operation.

24. The non-volatile storage system of claim 19, wherein: the sense operation comprises a verify operation.

25. The non-volatile storage system of claim 19, wherein: the first plurality of word lines is after the first word line in a word line programming order.

26. The non-volatile storage system of claim 19, wherein: the one or more control circuits determine whether or not a first plurality of word lines includes at least one programmed non-volatile storage element by determining concurrently whether the first plurality of word lines includes at least one programmed non-volatile storage element.

27. The non-volatile storage system of claim 26, wherein: the one or more control circuits determine concurrently whether the first plurality of word lines includes at least one programmed non-volatile storage element by applying a common voltage concurrently to each word line in the first plurality of word lines.

28. The non-volatile storage system of claim 19, wherein when the one or more control circuits determine that a first plurality of word lines includes at least one programmed non-volatile storage element, the one or more control circuits: e) determine whether a second plurality of word lines, different than the first plurality of word lines, includes at least one programmed non-volatile storage element, f) apply the first voltage to the second plurality of word lines while performing the sense operation when the one or more control circuits determine that the second plurality of word lines includes at least one programmed non-volatile storage element, and g) apply the second voltage to the second plurality of word lines while performing the sense operation when the one or more control circuits determine that the second plurality of word lines does not include at least one programmed non-volatile storage element.

29. The non-volatile storage system of claim 28, wherein: the first plurality of word lines is after the first word line, and the second plurality of word lines is after the first plurality of word lines, in a word line programming order.

30. A non-volatile storage system, comprising:
a set of non-volatile storage elements;
a set of word lines in communication with the set of non-volatile storage elements; and
one or more control circuits in communication with the set of non-volatile storage elements and the set of word lines, the one or more control circuits: a) store data which indicates whether or not a first word line has been used in a programming operation since a last erase operation, and b) access the data for use in setting a level of a voltage which is applied to the first word line during a sense operation of at least one non-volatile storage element associated with a second word line.

31. The non-volatile storage system of claim 30, wherein: the first word line is after the second word line in a word line programming order.

32. The non-volatile storage system of claim 30, wherein: the data is stored in at least one non-volatile storage element associated with the first word line.

33. The non-volatile storage system of claim 30, wherein: the sense operation comprises a read operation.

34. The non-volatile storage system of claim 30, wherein: the sense operation comprises a verify operation.

35. The non-volatile storage system of claim 30, wherein: the first word line is at a predetermined word line position in a set of word lines.

36. The non-volatile storage system of claim 30, wherein: the one or more control circuits: c) store second data which indicates whether or not a third word line has been used in an associated programming operation since the last erase operation, and d) subsequently, access the second data for use in setting a level of a voltage which is applied to the third word line during the sense operation.

37. The non-volatile storage system of claim 36, wherein: the second data is stored in at least one non-volatile storage element associated with the third word line.

38. The non-volatile storage system of claim 36, wherein: the first and third word lines are at predetermined word line positions in a set of word lines.

* * * * *